United States Patent
Wang et al.

(10) Patent No.: US 10,641,840 B2
(45) Date of Patent: May 5, 2020

(54) SYSTEMS, METHODS AND PATCHES FOR MONITORING A STRUCTURAL HEALTH OF A CONNECTOR IN OVERHEAD TRANSMISSION LINES

(71) Applicant: UT-Battelle, LLC, Oak Ridge, TN (US)

(72) Inventors: Hong Wang, Oak Ridge, TN (US); Jy-An Wang, Oak Ridge, TN (US); Fei Ren, Philadelphia, PA (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 182 days.

(21) Appl. No.: 15/880,081

(22) Filed: Jan. 25, 2018

(65) Prior Publication Data

US 2018/0210024 A1    Jul. 26, 2018

Related U.S. Application Data

(60) Provisional application No. 62/450,234, filed on Jan. 25, 2017.

(51) Int. Cl.
| | |
|---|---|
| *G01R 31/66* | (2020.01) |
| *H01R 13/66* | (2006.01) |
| *H02G 7/00* | (2006.01) |
| *G01R 31/08* | (2020.01) |
| *H04B 3/54* | (2006.01) |
| *H01L 41/04* | (2006.01) |
| *G01R 29/22* | (2006.01) |

(Continued)

(52) U.S. Cl.
CPC ......... *G01R 31/66* (2020.01); *H01R 13/6683* (2013.01); *H02G 7/00* (2013.01); *G01R 29/22* (2013.01); *G01R 31/085* (2013.01); *H01L 41/042* (2013.01); *H01L 41/047* (2013.01); *H01L 41/08* (2013.01); *H04B 3/54* (2013.01)

(58) Field of Classification Search
CPC ...... G01R 31/04; G01R 29/22; G01R 31/085; H01R 13/6683; H02G 7/00; H01L 41/042; H01L 41/047; H04B 3/54
See application file for complete search history.

(56) References Cited

U.S. PATENT DOCUMENTS

| | | | | |
|---|---|---|---|---|
| 2008/0231294 | A1* | 9/2008 | You | G01N 27/02 324/725 |
| 2013/0192870 | A1* | 8/2013 | Wang | H02G 15/08 174/90 |
| 2013/0300521 | A1* | 11/2013 | Khine | H03H 9/02228 333/187 |

OTHER PUBLICATIONS

Annamdas, V.G.M. et al., "Influence of loading on the electromechanical admittance of piezoceramic transducers", Smart Materials and Structures, Sep. 7, 2007, pp. 1888-1897, vol. 16, No. 5.

(Continued)

*Primary Examiner* — Patrick Assouad
*Assistant Examiner* — Feba Pothen
(74) *Attorney, Agent, or Firm* — Scully, Scott, Murphy & Presser, P.C.

(57) ABSTRACT

Systems, methods and piezoelectric patches are provided for monitoring the structural health of connectors in overhead transmission lines. A plurality of piezoelectric patches is mounted to different locations on the connector. At least one of the patches is actuated using an AC voltage and certain electrical properties either from the same patch or of a different patch are evaluated over time to determine the structural health of the connectors.

22 Claims, 15 Drawing Sheets

(51) Int. Cl.
H01L 41/08 (2006.01)
H01L 41/047 (2006.01)

(56) References Cited

OTHER PUBLICATIONS

Hey, F. et al., "Optimized Parallel Interrogation and Protection of Piezo-transducers in Electromechanical Impedance Technique", Journal of Intelligent Material Systems and Structures, Jun. 2006, pp. 457-468, vol. 17.
Jondahl, D.W. et al., "Connector Performance of New vs. Service Aged Conductor", Transmission and Distribution Conference, 1991, Proceedings of the 1991 IEEE Power Engineering Society, Sep. 1991, pp. 857-861.
Niaidu, A.S.K. et al., "Damage detection in concrete structures with smart piezoceramic transducers", Proc. SPIE 5062, Smart Materials, Structures, and Systems, 2003, pp. 684-690.
Park, S. et al., "MFC-Based Structural Health Monitoring Using a Miniaturized Impedance Measuring Chip for Corrosion Detection", Research in Nondestructive Evaluation, Apr. 2007, pp. 139-150, vol. 18, Issue 2.
Pasini, C. et al., "High Temperature Current Cycle Test of Implosive Connectors on ACSS Conductor", Transmission and Distribution Conference and Exposition, 2010 IEEE PES, Apr. 2010, pp. 1-8.
Whicker, D., "Before Lines Fall Down," Transmission and Distribution World, Jan. 1, 2010, pp. 1-5.
Snell, J. et al., "Improving results of thermographic inspections of electrical transmission and distribution lines," Proc. of 9th Int. Conf. On Transmission and Distribution Construction, Operation and Live-Line Maintenance, 2000, pp. 135-144.
Wang, J. et al., "The Integrity of ACSR Full Tension Splice Connector at Higher Operation Temperature," IEEE Transactions on Power Delivery, Apr. 2008, pp. 1158-1165, vol. 23 No. 2.
Xu, Y. G. et al., "A Modified Electro-mechanical Impedance Model of Piezoelectric Actuator-sensors for Debonding Detection of Composite Patches", Journal of Intelligent Material Systems and Structures, Jun. 2002, pp. 389-396, vol. 13.
Liang, C. et al., "Coupled Electro-Mechanical Analysis of Adaptive Material Systems—Determination of the Actuator Power Consumption and System Energy Transfer," Journal of Intelligent Material Systems and Structures, Jan. 1994, pp. 12-20, vol. 5.
Nguyen, C. et al., "The influence of temperature and bonding thickness on the actuation of a cantilever beam by PZY patches," Smart Materials and Structures, 2004, pp. 851-860, vol. 13.
Yang, Y. et al., "Practical issues related to the application of the electromechanical impedance technique in the structural health monitoring of civil structures: I. Experiment", Smart Materials and Structures, 2008, pp. 1. 1-14, vol. 7.
MatWeb Material Property Data, "Aluminum 1100-H14", http://www.matweb.com/search/datasheet.aspx?matguid=c0652f2efeac49b89b50e7e4c6fba759&ckck=1, Accessed Feb. 2016.
Wang, H. et al., "Effects of Electric Field and Biaxial Flexure on the Failure of Poled Lead Zirconate Titanate," IEEE Transactions on Ultrasonics, Ferroelectrics and Frequency Control, Dec. 2008, pp. 2559-2570, vol. 55, No. 12.
Wang, H. et al., "Strength Properties of Poled Lead Zirconate Titanate Subjected to Biaxial Flexural Loading in High Electric Field," J. Am. Ceram. Soc., 2010, pp. 2843-2849, VOL. 93, No. 9.
Zhang, K. et al., "Strength properties of aged poled lead zirconate titanate subjected to electromechanical loadings", Smart Materials and Structures, 2012, pp. 1-7, vol. 21.
Zhang, K. et al. "Biaxial flexural strength of poled lead zirconate titanate in high electric field with extended field range", Ceramics International, 2013, pp. 2023-2030, vol. 39.
Piezo Systems, Inc., "Piezoceramic Materials & Properties", http://www.piezo.com, Accessed Feb. 2016.
Cotronics Co., "Resbond 989, High Purity Alumina Adhesive Offers Continuous Protection to 3000°F", www.cotronics.com, Accessed Feb. 2016.

3M Industrial Adhesives and Tapes Division, "3MTM Scotch-Weld, Epoxy Adhesive", http://multimedia.3m.com/mws/media/66998O/scotch-weldtm-epoxy-adhesive-dp420-blck-ns-blck-offwhit-lh.pdf, Accessed Feb. 2016.
Cotronics Co., "Super Flexible, 450°F Epoxy Is So Flexible You Can Tie It in a Knot", www.cotronics.com/catalog/09%20%204538.pdf, Accessed Feb. 2016.
Bhalla, S. et al., "High frequency piezoelectric signatures for diagnosis of seismic/blast induced structural damages", NDT&E International, 2004, pp. 23-33, vol. 37.
Wang, H. et al., "Fatigue of extracted lead zirconate titanate multilayer actuators under unipolar high field electric aycling", Journal of Applied Physics, pp. 234101-1-234101-12, vol. 116.
"EpoxySet: Dielectric Epoxy Adhesives", www.epoxysetinc.com/dielectric-epoxy/, last accessed Feb. 5, 2016.
Giurgiutiu, V. et al., "Recent advancements in the electromechanical (E/M) impedance method for structural health monitoring and NDE", Proc. SPIE Conference on Smart Structures and Integrated Systems, Mar. 1998, pp. 536-547, vol. 3329.
Giurgiutiu, V. et al., "Characterization of Piezoelectric Wafer Active Sensors," Journal of Intelligent Material Systems and Structures, Dec. 2000, pp. 959-976, vol. 11.
Niezrecki, C. et al., "Piezoelectric Actuation: State of the Art", Shock and Vibration Digest, Jul. 2001, pp. 269-280, vol. 33, No, 4.
Park, G. G et al., "Overview of Piezoelectric Impedance-Based Health Monitoring and Path Forward," Shock and Vibration Digest, Nov. 2003, pp. 451-463, vol. 35, No. 6.
Annamdas, V. G. M. et al., "Application of Electromechanical Impedance Technique for Engineering Structures: Review and Future Issues", Journal of Intelligent Material Systems and Structures, 2010, pp. 41-59, vol. 21.
Lamb, H., "On Waves in an Elastic Plate", Proceedings of the Royal Society of London, Series A, Containing Papers of a Mathematical and Physical Character, Mar. 1, 1917, pp. 114-128, vol. 93, No. 648.
Worlton, D. C., "Experimental Confirmation of Lamb Waves at Megacycle Frequencies", Journal of Applied Physics, 1961, pp. 967-971, vol. 32.
Na, W. B. et al., "Underwater Pipeline Inspection Using Guided Waves," Journal of Pressure Vessel Technology, May 2002, pp. 196-200, vol. 124.
Qing, X. et al., "An Active Diagnostic System for Structural Health Monitoring of Rocket Engines", Journal of Intelligent Material Systems and Structures, Jul. 2006, pp. 619-628 , vol. 17.
Qing, X. et al., "A real-time active smart patch system for monitoring the integrity of bonded repair on an aircraft structure" Smart Materials and Structures, 2006, pp. N66-N73, vol. 15.
Mijarez, R. et al., "Flood member detection for real-time structural health monitoring of sub-sea structures of offshore steel oilrigs", Smart Materials and Structures, 2007, pp. 1857-1869, vol. 16.
Okafor, A. C. et al., "Delamination prediction in composite beams with built-in piezoelectric devices using modal analysis and neural network", Smart Materials and Structures, 1996, pp. 338-347, vol. 5.
Saafi, M. et al. "Health monitoring of concrete structures strengthened with advanced composite materials using piezoelectric transducers", Composites: Part B, 2001, pp. 333-342, vol. 32.
Song, G. et al., "Smart aggregates: multi-functional sensors for concrete structures—a tutorial and a review", Smart Materials and Structures, Mar. 18, 2008, pp. 1-17, vol. 17.
Yan, S. et al., "Health monitoring of reinforced concrete shear walls using smart aggregates", Smart Materials and Structures, Mar. 9, 2009, pp. 1-6, vol. 18.
Gu, H. et al., "Multi-functional smart aggregate-based structural health monitoring of circular reinforced concrete column subjected to seismic excitations", Smart Materials and Structures, May 11, 2010, pp. 1-7, vol. 19.
Randall, C. A. et al., "High Strain Piezoelectric Multilayer Actuators—A Material Science and Engineering challenge", Journal of Electroceramics, 2005, pp. 177-191, vol. 14.
Zhang, S et al., "Elastic, Piezoelectric, and Dielectric Characterization of Modified BiScO3-PbTiO3 Ceramics", IEEE Transactions on Ultrasonics, Ferroelecrics, and Frequency Control, Nov. 2005, pp. 2131-2139,vol. 52, No. 11.

(56) References Cited

OTHER PUBLICATIONS

Wang, H., Wang, J., Ren, F. And Chan, J., "Smart patch integration development of compression connector structural health monitoring in overhead transmission lines", Proc. SPIE 9806, Smart Materials and Nondestructive Evaluation for Energy Systems, 2016, pp. 980606-1-980606-11.

Wang, J.A. et al., "Evaluation of High Temperature Integrity of ACSR Two-Stage Splice Connectors and Developmeni of Next Generation Advanced Connectors", ORNL/TM-2010/340 Oak Ridge National Laboratory, 2011, pp. 1-34.

Alcan Cable, "Bare Overhead Transmission and Distribution Conductors", www.cable.alcan.com, 2008, pp. 1-36, Accessed Feb. 2013.

McMaster-Carr, "Low-Carbon Steel Tubing", www.mcmaster.com/, Accessed Jan. 2017.

efunda, "Carbon Steel AISI 1005", www.efunda.com/materials/alloysi/arbon_steelsi/how_carbon.cfm?ID=AISI_1005&show_prop=all&Page_Title=AISI%201005, Accessed Jan. 2017.

Wang, H. et al., "Mechanical Strength Responses of Poled Lead Zirconate Titanate Under Extreme Electric Field and Various Temperature Conditions", Proceedings of the ASME 2016 International Mechanical Engineering Congress and Exposition, Nov. 11-17, 2016, pp. 1-10.

Esteban, J., "Analysis of the Sensing Region of a PZT Actuator-Sensor", PhD Dissertation, Virginia Polytechnic Institute and State University, Jul. 1996, pp. 1-150.

Park, G., "Assessing Structural Integrity using Mechatronic Impedance Transducers with Applications in Extreme Environments," PhD Dissertation, Virginia Polytechnic Institute and State University, Apr. 2000, pp. 1-138.

Tomblin, J. et al., "Shear Stress-Strain Data for Structural Adhesives," DOT/FAA/AR-02/97, Dept. of Aerospace Engineering, Wichita State University, Wichita, KS 67260, Nov. 2002, pp. 1-60.

Preformed Line Products, "Transmission Line Repair Manual", www.preformed.com, accessed on Feb 20, 2012.

SensorLink, "Ohmstik Plus Operators Manual", http://www.sensorLink.com, assessed on Jun 7, 2012.

ANSI C119.4-2011, "American National Standard for Electrical Connectors—Connector for Use Between Aluminum-to-Aluminum and Aluminum-to-Copper Conductors Designated for Normal Operation at or Below 93°C and Copper-to-Copper Conductors Designed for Normal Operation at or Below 100°C", National Electrical Manufacturers Association, Mar. 30, 2011.

Di Troia, G., "Effects of high temperature operation on overhead transmission full-tension joints and conductors", http://www.fciconnect.com/, Aug. 2000.

Tseng, K. et al., "Smart piezoelectric transducers for in situ health monitoring of concrete", Smart Materials and Structures, 2004, pp. 1017-24, vol. 13.

Wang, J.A. et al., "The Effective Lifetime of ACSR Full Tension Splice Connector Operated at Higher Temperature", IEEE power engineering society joint technical committee meeting, Mar. 2009, pp. 1-10, vol. 40, No. 23.

Wang, H., Wang, J., Swindeman, J., Ren, F. And Chan, J.,, "Structural health monitoring of compression connectors for overhead transmission lines", Proc. SPIE 10169, Nondestructive Characterization and Monitoring of Advanced Materials, Aerospace, and Civil Infrastructure, Apr. 19, 2017, pp. 101690M-1 to 101690M-12, vol. 10169.

Wang, J.A. et al., "The Lifetime Estimate for ACSR Single-Stage Splice Connector Operating at Higher Temperatures", IEEE Transactions on Power Delivery, Jul. 2011, pp. 1317-1325, vol. 26, No. 3.

\* cited by examiner

|  | Symbol | Unit | Value |
|---|---|---|---|
| Relative dielectric constant | $K_3^T$ |  | 1800 |
| Piezoelectric strain coefficient | $d_{31}$ | pm/V | −190 |
| Coupling coefficient | $k_{31}$ |  | 0.35 |
| Coercive field | $E_c$ | MV/m | 1.2 |
| Density | $\rho$ | Kg/m$^3$ | 7800 |
| Elastic modulus | $Y_1^E$ | GPa | 66 |
| Flexural strength | $\sigma_f$ | MPa | 140 |
| CTE | $\alpha$ | μm/m–°C | 4 |
| Curie temperature | $T_c$ | °C | 350 |

SYSTEMS, METHODS AND PATCHES FOR MONITORING A STRUCTURAL HEALTH OF A CONNECTOR IN OVERHEAD TRANSMISSION LINES

CROSS REFERENCE TO RELATED APPLICATION

The present application claims benefit of U.S. Application No. 62/450,234, filed on Jan. 25, 2017, all of the contents of which are incorporated herein by reference.

STATEMENT REGARDING FEDERALLY SPONSORED RESEARCH

This invention was made with government support under Prime Contract No. DE-AC05-000R22725 awarded by the U.S. Department of Energy. The government has certain rights in the invention.

FIELD OF THE DISCLOSURE

This disclosure relates to monitoring and determining a structural health of a connector. More specifically, this disclosure relates to systems, methods and piezoelectric patches for monitoring and determining the structural health for compression connectors in overhead transmission lines.

BACKGROUND

Connectors, such as compression connectors are used in overhead power transmission lines, e.g., high-voltage power delivery systems. For example, a full-tension splice connector (such as a two-stage aluminum conductor steel reinforced (ACSR) compression connector) provides both mechanical linkage and electric conducting channel for the power transmission lines. A connector may include an inner steel sleeve crimped on steel core and an outer aluminum sleeve also crimped but on aluminum strands. However, the performance of the connector can degrade in service. For example, strands within a connector may become loosened or damaged after a specified number of thermal cycles resulting in an increased sagging of the power transmission lines and eventually the mechanical breakdown of connectors. Given the number and density of power transmission lines deployed, it is important to monitor the integrity of the connector. Especially also given the age of certain power transmission lines in use. Additionally, monetary considerations make the utility industries maximize the utilization of the system and operate the facilities at the edge of the lifetime of the equipment.

Electric utilities currently conduct scheduled inspections that include thermal and electric measurements to monitor the performance of transmission lines using infrared cameras and Ohmstik. However, the current methods do not provide information regarding the structural health and integrity of the connector. The degradation of the structural health of the connector would eventually induce the breakdown of the connector and failure of the power transmission system.

The structural conditions determine the rated tensile breaking strength (RTBS). However, the current inspection methods including using infrared cameras and the Ohmstik do not link the measurements in the field to the RTBS, and therefore, cannot predict the lifetime of the connectors.

Also, current field inspections are influenced by various factors such as weather conditions including wind and temperature. Further, data from different measurement sessions are difficult to correlate.

SUMMARY

Accordingly, disclosed is a system for monitoring and determining the structural health of a connector.

In aspects of the disclosure, the system may comprise a piezoelectric patch attached to a sleeve of a compression connector, an impedance analyzer and a processor. The piezoelectric patch comprises a positive electrode, a piezoelectric element and a negative electrode. The impedance analyzer is in electrical communication with the piezoelectric patch via a first wire and a second wire. The first wire electrically couples the impedance analyzer and the positive electrode. The second wire electrically couples the impedance analyzer and the negative electrode.

The impedance analyzer is configured to supply an AC voltage to the piezoelectric patch and detect a current associated with the piezoelectric patch. The AC voltage is supplied at a plurality of frequencies from a minimum frequency to a maximum frequency in a step size.

The processor configured to determine the structural health of the compression connector based on a determined impedance associated with the piezoelectric patch at each of the plurality of frequencies, determined at two different times. The impedance is determined based on the AC voltage and the detected current, at each of the plurality of frequencies.

In aspects of the disclosure, the processor is configured to determine the structural health of the compression connector by converting the impedance into a conductance (G) for each of the plurality of frequencies and calculate a root mean square deviation. One of the two different times is a baseline measurement. The baseline measurement is stored in a storage device.

In aspects of the disclosure, the piezoelectric patch is bonded to the compression connector via an epoxy as a bonding layer.

In aspects of the disclosure, an electrode is attached to the sleeve of the compression connector adjacent to the piezoelectric patch. The second wire is connected to the electrode. The electrode is in electrical communication with the negative electrode via the sleeve, such that the negative electrode is indirectly connected to the impedance analyzer.

A plurality of piezoelectric patches may be bonded to the compression connector at different locations such as a core-grip section and/or a conductor section.

Each piezoelectric patch may be electrically coupled to the impedance analyzer by switching connections.

In aspects of the disclosure, the processor is configured to selectively couple the impedance analyzer to the plurality of piezoelectric patches via one or more of a plurality of switches. When the one or more switches couples the impedance analyzer to a respective piezoelectric patch, the impedance analyzer is configured to supply the AC voltage to the respective piezoelectric patch and detect the current associated with the respective piezoelectric patch. The impedance analyzer may be configured to determine the impedance associated with the respective piezoelectric patch based on the AC voltage and the detected current, at each of the plurality of frequencies.

In aspects of the disclosure, the processor, for one or more of the plurality of piezoelectric patches, is configured to determine the structural health of the compression connector by converting the impedance into an conductance (G) for each of the plurality of frequencies and calculate a root mean square deviation based on the conductance for all of the plurality of frequencies obtained at the two different times. The processor, for the one or more of the plurality of piezoelectric patches, compares the calculated root mean square deviation with a threshold, and when the calculated root mean square deviation is greater than the threshold, the processor determines that the compression connector is damaged.

In aspects of the disclosure, the processor is configured to determine a location of the damage based on which of the one or more of the plurality of piezoelectric patches had the calculated root mean square deviation greater than the threshold.

In aspects of the disclosure, the system further comprises communication interface. The communication interface is configured, under the control of the processor, to transmit the determined structural health of the compression connector to a hub station.

In other aspects of the disclosure, the system for determining a structural health of a compression connection comprises a plurality of piezoelectric patches, a voltage generation circuit, a data acquisition circuit, a plurality of switches and a processor.

The plurality of piezoelectric patches is attached to a sleeve of the compression connector at different locations. Each patch comprises a positive electrode, a piezoelectric element and a negative electrode.

The voltage generation circuit is in electrical communication with each piezoelectric patch via a respective first wire and a respective second wire. Each first wire electrically couples the voltage generation circuit and the positive electrode of the respective piezoelectric patch, and each second wire electrically couples the voltage generation circuit and the negative electrode of the respective piezoelectric patch. The voltage generation circuit is configured to supply an AC voltage to the first piezoelectric patch. The AC voltage being supplied at a plurality of frequencies from a minimum frequency to a maximum frequency in a step size.

The data acquisition circuit is also in electric communication with each piezoelectric patch via a respective first wire and a respective second wire. Similarly, each first wire electrically couples the data acquisition circuit and the positive electrode of the respective piezoelectric patch, and each second wire electrically couples the data acquisition circuit and the negative electrode of the respective piezoelectric patch. The data acquisition circuit is configured to detect a current associated with the second piezoelectric patch, and convert the current associated with the second piezoelectric patch into a voltage.

The plurality of switches is configured to selectively couple each piezoelectric patch to one of the voltage generation circuit and the data acquisition circuit at a time.

The processor is configured to determine the structural health of the compression connector based on a determined ratio at each of the plurality of frequencies, determined at two different times.

In aspects of the disclosure, the ratio is determined from output AC voltage to the first piezoelectric patch and the voltage converted from the current associated with the second piezoelectric patch, at each of the plurality of frequencies.

In aspects of the disclosure, the plurality of switches is configured to selectively couple the voltage generation circuit to one of the plurality of piezoelectric patches and the data acquisition circuit to another of the plurality of piezoelectric patches.

When the voltage generation circuit is coupled to the one of the plurality of piezoelectric patches, the data acquisition circuit is coupled to another of the plurality of piezoelectric patches, and the voltage generation circuit is configured to supply the AC voltage to the one of the plurality of piezoelectric patches and the data acquisition circuit is configured to detect a current associated with the another of the plurality of piezoelectric patches. The data acquisition circuit is configured to convert the current associated with the another of the plurality of piezoelectric patches into a voltage.

The processor is configured to determine the structural health of the compression connector based on the determined ratio at each of the plurality of frequencies, determined at two different times. In aspects of the disclosure, the ratio is determined from output AC voltage to the one of the plurality of piezoelectric patches and the voltage converted from the current associated with the another of the plurality of piezoelectric patches, at each of the plurality of frequencies.

DRAWINGS

FIG. 14 is a table showing certain properties of a piezoceramic sheet which may be used for the PZT patch in accordance with aspects of the disclosure.

DETAILED DESCRIPTION

Figure 1:
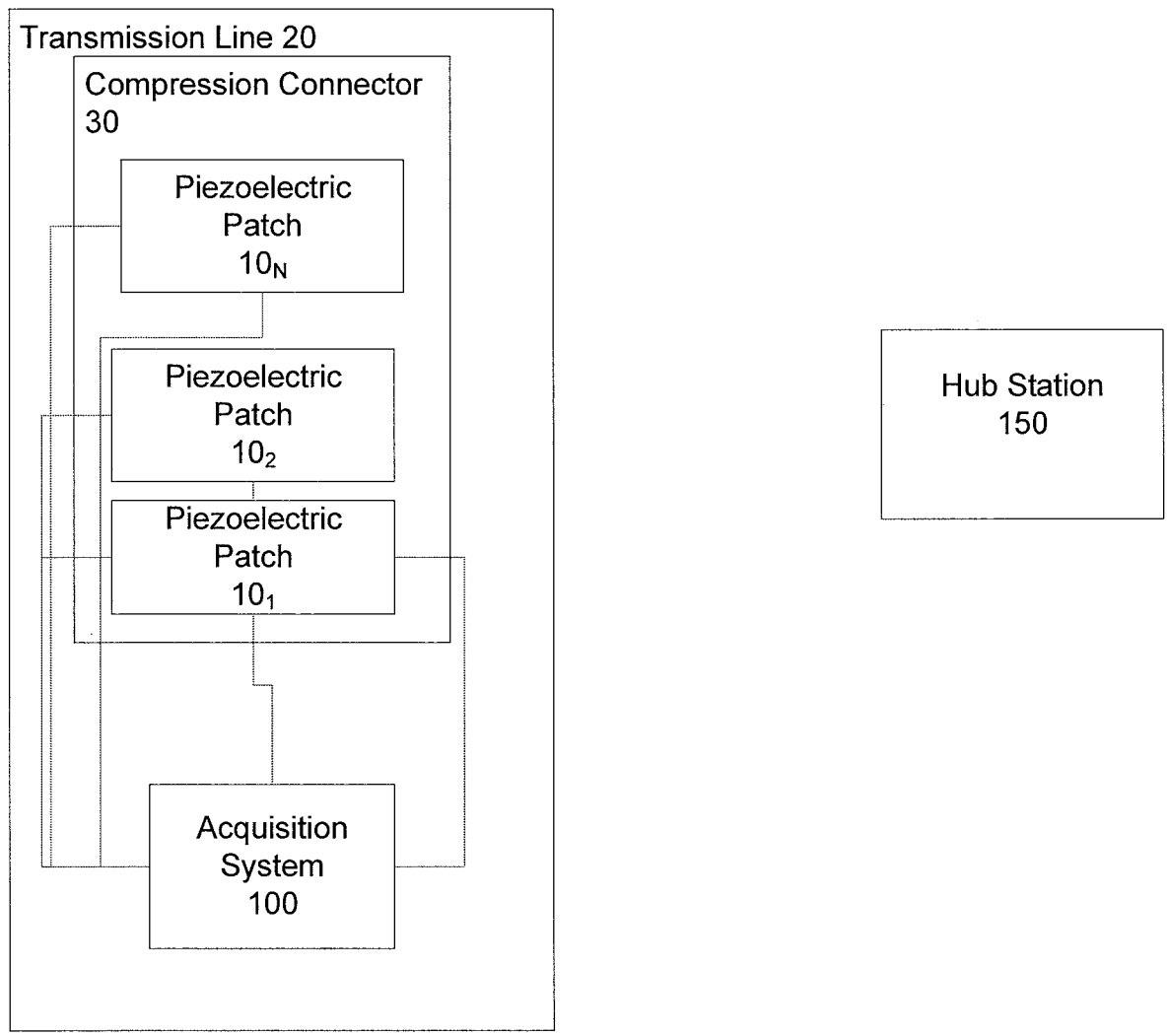
FIG. 1 illustrates a block diagram of a structural health monitoring (SHM) system in accordance with aspects of the disclosure.
Figure 5A:
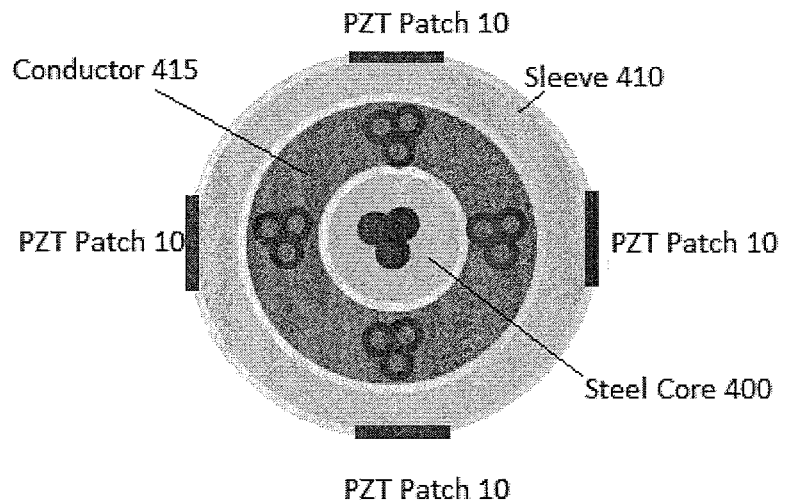
FIG. 5A illustrates a cross-section of a connector through a conductor section having a plurality of piezoelectric patches bonded to a sleeve in accordance with aspects of the disclosure.
Figure 5B:
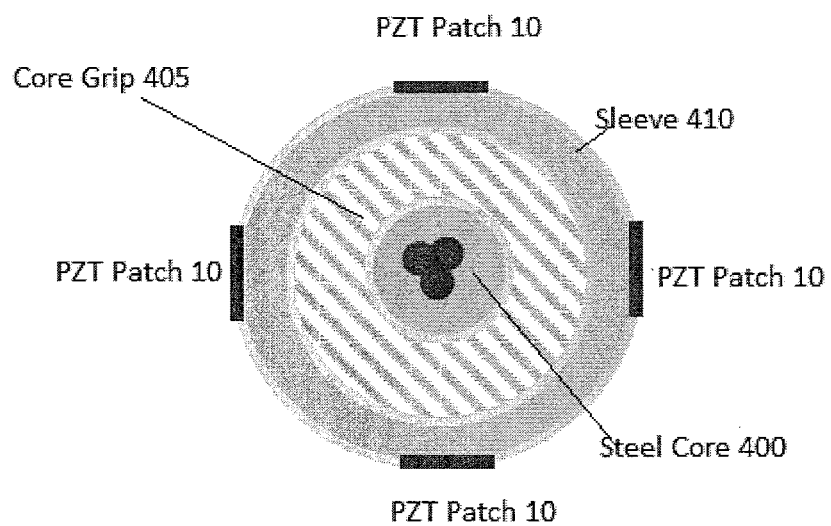
FIG. 5B illustrates a cross-section of a connector through a core-grip section having a plurality of piezoelectric patches bonded to a sleeve in accordance with aspects of the disclosure.

FIG. 1 illustrates a block diagram of a structural health monitoring (SHM) system 1 in accordance with aspects of the disclosure. The system 1 comprises a plurality of piezoelectric (PZT) patches (collectively 10, and individually 10₁-10$_N$) for structural evaluation. Each PZT patch 10₁-10$_N$ is mounted or bonded to a different location along the exterior to a connector 30 (e.g., compression connector) as shown in FIGS. 5A and 5B. In the description connector and compression connector are used interchangeably.

A compression connector 30, such as a two-stage ACSR connector, has two types of portions: a core-grip section and a conductor section. ACSR connector has two conductor sections on opposite sides of the core-grip section.

FIG. 5A is a cross-sectional view of the conductor section. The conductor section has a steel core 400. A conductor 415 surrounds the steel core 400. Sleeve 410 surrounds the conductor 415. The conductor 415 comprises a plurality of aluminum strands. The plurality of aluminum strands are illustrated in FIG. 5A by circles (unfilled). The steel core 400 comprises a plurality of strands. The strands are illustrated in FIG. 5A by filled circles.

FIG. 5A illustrates four PZT patches 10 mounted to the exterior surface of the sleeve 410 to monitor the structural integrity of one of the conductor sections. For example, the plurality of PZT patches 10 can monitor and detect loosening of strands within the steel core 400 and the conductor 415. Loosening of the conductor strands and/or core strands may be caused by a relaxation of the sleeve 410. In FIG. 5A, the PZT patches 10 are arranged with approximately 90 degrees between adjacent PZT patches 10. The number of patches and spacing between adjacent patches in FIG. 5A is illustrated for descriptive purposes only. In an aspect of the disclosure, additional PZT patches 10 are mounted to the other conductor section on the opposite side of the core-grip section.

FIG. 5B illustrates a cross-sectional view of the core-grip section. The core-grip section includes a steel core 400 (the same as the conductor section) and a core grip 405 surrounding the steel core 400. Similar to the conductor section, a plurality of PZT patches 10 are mounted to the exterior surface of the sleeve 410 to monitor the structural integrity of core-grip section. For example, the plurality of PZT patches 10 can monitor and detect loosening of strands within the steel core 400. In FIG. 5B, the PZT patches 10 are arranged with approximately 90 degrees between adjacent PZT patches 10. The number of patches and spacing between adjacent patches in FIG. 5B is illustrated for descriptive purposes only.

In an aspect of the disclosure, the number and placement of the PZT patches 10 is determined based on testing of portions of the connector 30 which are susceptible to damage. Stress conditions and potential damage areas are different between portions of the connector 30 such as the core-grip section and conductor section; as such the number of PZT patches 10 used in each section may be different.

In an aspect of the disclosure, the PZT patches 10 can be sealed by a coating or a layer of insulating polymer such as, but not limited to, silicone.

In an aspect of the disclosure, each PZT patch 10₁-10$_N$ works independently (in an interrogation process with both actuation and sensing). The location of a specific PZT patch is a priori known and thus, the actuation/sensing can be correlated to a specific location or area in the connector 30, such as one of the conductor sections or core-grip section. The number of PZT patches 10 required for monitoring depends on a size of the patch, the sensing range of the patch and the total area to be monitored. The sensing range of the PZT patches 10 may be from about 0.4 m to 2.0 m. The range depends on the type of connector and material of the outer sleeve.

In an aspect of the disclosure, the PZT patches 10 are mounted to the exterior surface of the connector, e.g., sleeve, at preset positions in both a longitudinal and circumferential direction. Mounting of the PZT patches will be described later in detail with respect to FIG. 6.

The system 1 further comprises an acquisition system 100. The acquisition system 100 is electrically coupled to each of the plurality of PZT patches 10 via two wires (e.g., shown in FIG. 7). In an aspect of the disclosure, the acquisition system 100 is mounted to a power transmission line 20. The acquisition system 100 may be mounted using a flexible bonding material that is weather resistant. The acquisition system 100 may comprise a housing 220 (shown in FIG. 2), that is contoured to match the shape of the power transmission line 20. In another aspect of the disclosure, the acquisition system 100 may be mounted to a junction box.

The wires coupling the acquisition system 100 to each of the plurality of PZT patches 10 extend along the exterior of the power transmission line 20. The wires may be sealed with weather resistant material and enclosed in a protective sleeve.

The acquisition system 100 is configured to both actuates a PZT patch 10 and sense/detect the results of the actuation.

For example, in an aspect of the disclosure, the acquisition system 100 actuates a PZT patch (e.g., 10₁) (which in turn actuates the connector 30) with a specific AC voltage (at a specific frequency(ies) (input voltage) and sense the response of the connector 30 by measuring the electric current of the same PZT patch (e.g., 10₁) resulting from the piezoelectric effect (output current).

The structural integrity of the connector 30 dictates an input voltage verses output current signature and the health of the connector 30 can be monitored through variation of the signature over time, e.g., between a baseline condition and a monitored time.

In an aspect of the disclosure, the specific signature analyzed is the signature of conductance G. The conductance is a real part of the admittance Y. Admittance Y is the inverse of the impedance Z. The Admittance Y consists of the real part (conductance G) and imaginary part (susceptance B).

An impedance signature may be influenced by structural damage and external axial force on the compression connector 30, which also impacts an admittance signature. When installed, the compression connector 30 is subjected to a suspension force imposed by the transmission line 20, e.g., external axial force. The external axial forces impact mainly the imaginary part (susceptance B). In contrast, structural damage impacts mainly the real part (conductance G).

In another aspect of the disclosure, other signatures may be analyzed additionally or alternatively. Analysis of other signatures will be discussed later in detail. The term signature used herein means a value as a function of frequency, such as voltage ratio, impedance or conductance as a function of frequency.

The stress wave generated by the piezoelectric effect of a PZT patch (e.g., 10₁) propagates in all directions, e.g., longitudinal, circumferential and radial directions. The reflecting waves from various interfaces and scattering centers within the connector 30 which are captured by the same PZT patch (e.g., 10₁). Therefore, the signature(s) obtained is/are a comprehensive effect of stress wave propagations in various pathways and are sensitive to any form of structural damage such as loosening of connector strands. For example, loosening of the conductor and core strands has a direct impact on the structure impedance because of changes in stiffness and damping.

The system 1 further comprises a hub station 150. The hub station 150 may be a central monitor station for the utility system such as a central station of a smart grid. The acquisition system 100 is configured to wirelessly communicate with the hub station 150.

Figure 2:
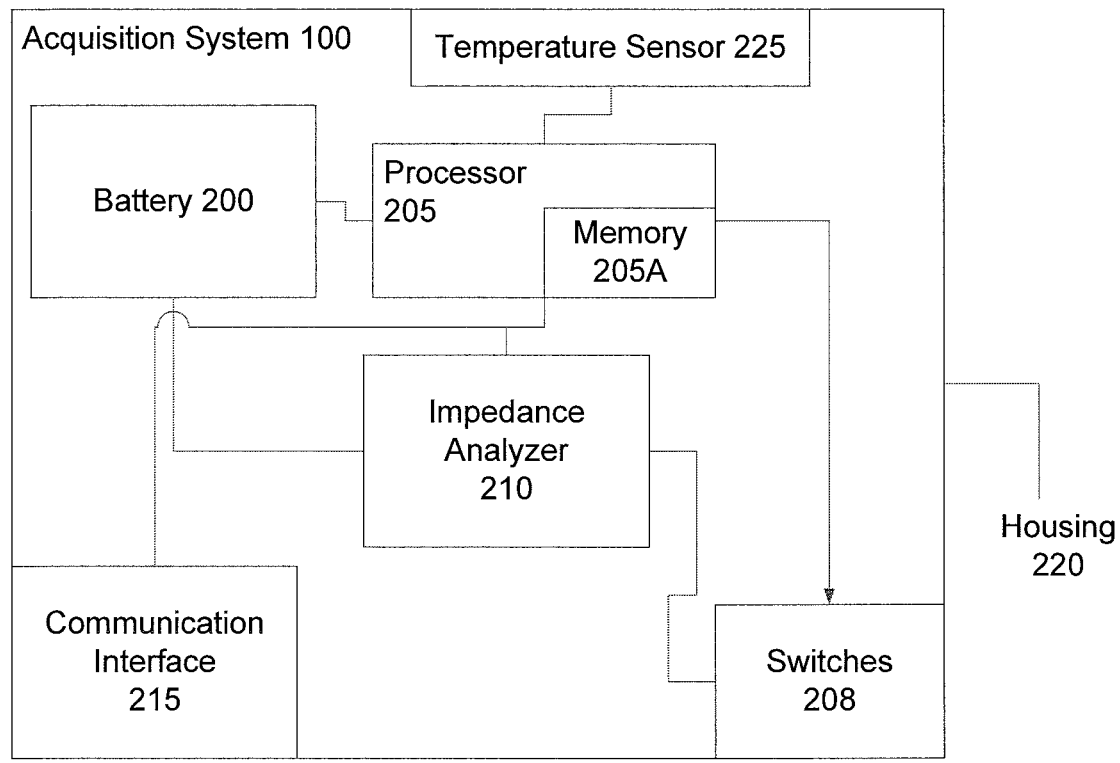
FIG. 2 illustrates a block diagram of an acquisition system in accordance with aspects of the disclosure.

FIG. 2 illustrates a block diagram of an acquisition system 100 in accordance with aspects of the disclosure.

The acquisition system 100 comprises a battery 200, a processor 205, an impedance analyzer 210, switches 208, a communication interface 215 and a temperature sensor 225.

The battery 200 is a rechargeable battery. The battery 200 may be recharged via energy harvesting such as, but not limited to, solar power. The battery is configured to supply power to the processor 205 and impedance analyzer 210.

The impedance analyzer 210 may be an AD5933 system (Analog Devices® Inc., Norwood, Mass.). The impedance analyzer 210 is configured to provide an AC voltage at specific frequencies. In an aspect of the disclosure, the system includes an on-board frequency generator including an oscillator. In another aspect of the disclosure, the system includes a function generator. This allows the PZT patches 10 (and connector 30) to be actuated with precise known frequencies. The impedance analyzer 210 is programmable for a set frequency step or sweep.

In an aspect of the disclosure, the impedance analyzer 210 is configured to supply an AC voltage from a preset minimum frequency to a preset maximum frequency using a preset step size. When the AD5933 is used, a start frequency (e.g., minimum frequency in the sweep), frequency resolution (e.g., step size) and number of points in the sweep is programmed in various registers in the AD5933. In an aspect of the disclosure, a user may program the values in the processor 205. In another aspect of the disclosure, a user may program a minimum value and a maximum value and a number of points in the sweep. The processor 205 may calculate the frequency resolution based on the min/max and the number of points. In another aspect of the disclosure, the user may program a minimum and maximum frequency and the frequency resolution and the processor 205 may calculate the number of points in the sweep.

The start frequency, frequency resolution and number of points in the sweep may be configured prior to installation. In another aspect of the disclosure, the start frequency, frequency resolution and number of points in the sweep may be adjusted via a signal from the hub station 150 or under the control of the processor 205. In another aspect of the disclosure the amplitude of the output AC voltage is also set in advance.

The above values may be set in advance during a calibration process or during baseline determination. In as aspect of the disclosure, a frequency range with a high mode density is used, e.g., a frequency range having a large number of peaks (or anti-peaks) in the signature. For example, the frequency range may be determined by testing and analyzing the connector 30 prior to installation.

In an aspect of the disclosure, the frequency range is less than 500 kHz, to avoid the PZT patch 10 from becoming more sensitive to bonding conditions than structural conditions of the connector 30. In an aspect of the disclosure, a frequency range of 1 kHz to 300 kHz may be used. In another aspect of the disclosure, a frequency range of 1 kHz to 100 kHz may be used. A step size of 1 kHz may be used. In another aspect of the disclosure, a frequency range of 6 kHz to 8 kHz may be used.

The impedance analyzer 210 may also comprise a current to voltage conversion circuit. The AD5933 includes such a circuit. When the current is directly compared with a voltage, the current to voltage conversion circuit is omitted. In an aspect of the disclosure, the impedance analyzer 210 also comprises a programmable gain amplifier coupled to the current to voltage conversion circuit (if used). The impedance analyzer 210 is also configured to execute an analog to digital conversion and a discrete Fourier transform (DFT) on the converted voltage (which is proportional to the current detected from the PZT patches 10).

In an aspect of the disclosure, the impedance analyzer 210 further comprises an internal processor configured to calculate the impedance. In one aspect of the disclosure, this processor calculates the impedance based on the output AC voltage and the converted voltage from the detected current with the help of a calibration or feedback resistor. In another aspect of the disclosure, the impedance analyzer is configured to calculate the impedance from the output AC voltage and the detected current.

The real and imaginary parts of the calculated impedance are stored in a register of the impedance analyzer 210 and made available to the processor 205 via an interface. The processor 205 may be a microcontroller (or a CPU). The microcontroller may be configured to execute one or more programs stored in a computer readable storage device such as the memory 205A. The memory 205A may be, but not limited to, RAM, ROM and persistent storage. The memory 205A is any piece of hardware that is capable of storing information, such as, for example without limitation, data, programs, instructions, program code, and/or other suitable information, either on a temporary basis and/or a permanent basis.

In an aspect of the disclosure, the processor 205 is configured to control the impedance analyzer 210 to output the AC voltage at specific frequencies, e.g., from a minimum to maximum frequency via a step size (frequency sweep) to a specific PZT patch. The inputted values are transmitted to the impedance analyzer 210 from the processor 205. Additionally, the processor 205 is configured to retrieve the calculated impedance (real and imaginary parts) which is stored in the register(s) for each frequency, convert the impedance into conductance and subsequently determine the state of health based on a signature(s) (over time, e.g., two different times), which will be described in detail later. The processor 205 is configured to determine whether the connector 30 is damaged and the degree of the damage.

The signature may be impacted by the temperature. In an aspect of the disclosure, the memory 205A includes a pre-stored conversion table or equation to compensate for the temperature. For example, baseline measurements may be performed at multiple different temperatures and multiple sets of baseline values may be stored. When the monitored values are determined, the temperature is detected by the temperature sensor 225. The processor 205 selects the set of baseline values based on the detected temperature and uses the selected set of baseline values for the analysis. In an aspect of the disclosure, the number of sets of baseline values may be based on the size of the memory. The temperature range used for the baseline values includes the temperatures of the expected operating temperatures for the connector 30.

In another aspect of the disclosure, the processor 205 may interpolate the baseline values based on the sets of baseline values in memory. For example, the processor 205 may use two sets of baseline values that are the closest to the current temperature.

In an aspect of the disclosure, the impedance analyzer 210 comprises a temperature sensor and adjusts a temperature coefficient based on the detected temperature.

In an aspect of the disclosure, each PZT patch $10_1$-$10_N$ is assigned a unique identifier. This unique identifier may be used when transmitting a damage report to the hub station 150. The unique identifiers for the plurality of PZT patches 10 are stored in the memory 205A. Similarly, the unique identifiers are stored in the hub station 150.

In another aspect of the disclosure, the location of each PZT patch $10_1$-$10_N$ is also stored in the memory 205A in association with the unique identifier. For example, the location of a PZT patch 10 may be "top of core-grip section" or "bottom of conductor section (right or left)". The location of each PZT patch $10_1$-$10_N$ may also be stored in the hub station 150.

In an aspect of the disclosure, the hub station 150 may instruct the processor 205 to actuate a specific PZT patch 10 using either the specific location or unique identifier. The processor 205 may include either the specific location or unique identifier in damage report.

The impedance analyzer 210 is electrically connected to each patch 10 via a plurality of switches 208 controlled by the processor 205, two switches per PZT patch (one for each wire coupling a PZT patch to the impedance analyzer 210). The switches 208 may be a relay. In another aspect of the disclosure, the switches for the same PZT patch 10 may be a single throw-double pole switch. Therefore, instead of having two switches for the same patch, one switch may be used. In another aspect of the disclosure two rotary selector switches may be used. For example, one rotary selector switch is for wires coupled to the positive electrode and a second rotary selector switch for wires coupled to the negative electrode. In this aspect of the disclosure, the processor 205 is configured to control both rotary selector switches to couple the same PZT patch to the impedance analyzer 210 at a given time. In another aspect of the disclosure, instead of switches, the wires from the patches 10 may be connected to a multiplexer and the processor 205 selects the output(s) of the multiplexer.

Figure 4:
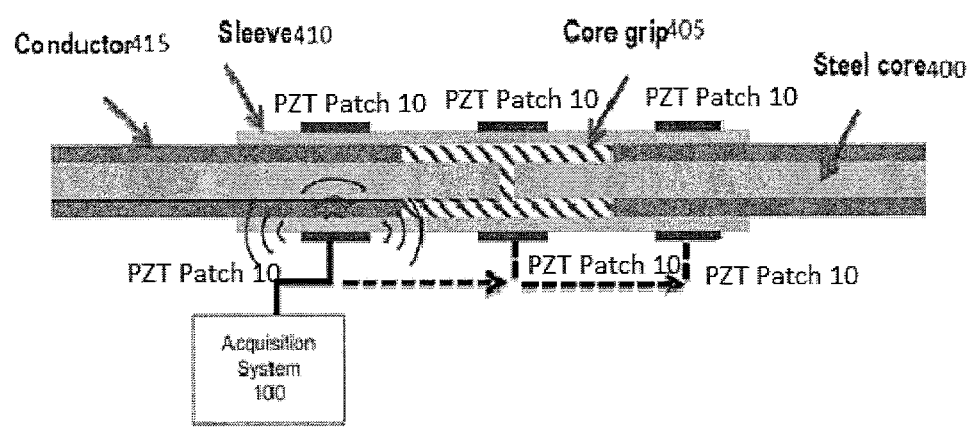
FIG. 4 illustrates a diagram of the acquisition system sequentially actuating a plurality of piezoelectric patches in accordance with aspects of the disclosure.

In an aspect of the disclosure, in one measurement session, the PZT patches 10 are tested sequentially such that the result can be correlated to a specific location. FIG. 4 shows the PZT patches 10 being sequentially actuated. In FIG. 4, the acquisition system 100 is shown separately from the connector 30 (and any transmission line 20) for descriptive purposes only and in practice, as described above, the acquisition system 100 may be mounted to the transmission line 20.

In FIG. 4, the PZT patch 10 that is being actuated and sensed is identified with signal markings around the PZT patch 10. The direction of the sequence is identified by the dashed arrow(s).

The processor 205 is configured to, for one measurement session, sequentially control the switches 208 to couple/decouple the PZT patches 10 to the acquisition system.

In an aspect of the disclosure, the timing for the measurement session(s) can be preset as a schedule. For example, the schedule may be stored in memory. For example, the schedule may comprise one measurement session per day or per week at a specific time of the day.

In another aspect of the disclosure, a measurement session may be triggered by the hub station 150.

In another aspect of the disclosure, the schedule for the measurement sessions may be adjusted based on the state of charge (SOC) of the battery 200. Accordingly, in this aspect of the disclosure, the processor 205 is configured to determine the SOC of the battery 200. The memory 205A may store thresholds for the SOC. When the SOC of the battery 200 is less than one or more of the thresholds, the processor 205 may adjust the schedule. For example, the processor 205 may delay a scheduled measurement session if the battery 200 has an SOC below one or more of the thresholds. Additionally, the processor 205 may adjust the step size based on the SOC of the battery 200. For example, the processor 205 may increase the step size if the SOC of the battery 200 is less than one or more of the thresholds.

In another aspect of the disclosure, the schedule for the measurement sessions may be adjusted based on the state of health of the connector 30. While the connector 30 may not yet be damaged, e.g., processor 205 determines that the connector 30 is not damaged, the signature may change from the baseline (less than a change indicating damage), but still provide a cause for concern. The processor 205 may adjust the schedule such that the measurement sessions are more frequent.

In another aspect of the disclosure, instead of a full measurement session, individual patches 10 may be actuated (out of sequence), e.g., on demand.

In an aspect of the disclosure, the communication interface 215 is a wireless communication interface capable of WIFI. In another aspect of the disclosure, the communication interface 215 is a GSM interface. The communication interface 215 may be mounted to the housing 220.

The temperature sensor 225 may be mounted to the housing 220. The temperature sensor may be a thermistor.

Figure 3:
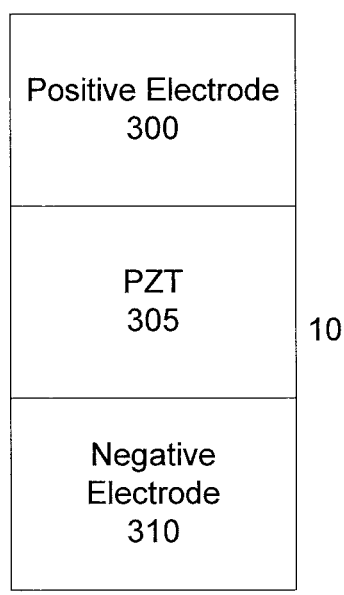
FIG. 3 illustrates a block diagram of a piezoelectric patch in accordance with aspects of the disclosure.

FIG. 3 illustrates a block diagram of a PZT patch 10 in accordance with aspects of the disclosure. Each PZT patch $10_1$-$10_N$ comprises a positive electrode 300, a piezoelectric material (PZT) 305 (referenced herein as PZT material and in FIG. 3 PZT) and a negative electrode 310.

Transmission lines 20 (and connectors 30) currently used in high-voltage overhead transmission are designed to operate at temperatures below 90° C. and, for limited periods of time (e.g., during emergencies), at temperatures as high as 125° C. Therefore, the PZT material must be able to satisfy the temperature requirement. Several piezoceramic systems are available to satisfy such temperature requirements, for example, modified BSPT (BiScO$_3$—PbTiO$_3$). In an aspect of the disclosure, the PZT material 305 may be lead zirconate titanate (Pb[Zr,Ti]O$_3$). The PZT patches 10 may be about 5-15 mm in width and length.

The positive and negative electrodes 300/310 may be made of nickel. In an aspect of the disclosure, the electrodes 300/310 are bonded to the PZT material 305 using plasma coating. In an aspect of the disclosure, the PZT material 305 with electrodes 300/310 may be provided as a piezoceramic sheet from Piezo Systems Inc. (Woburn Mass.), e.g., PSI-5A4E, industry type 5A, certain properties thereof is shown in Table 1400 (FIG. 14).

Figure 6:
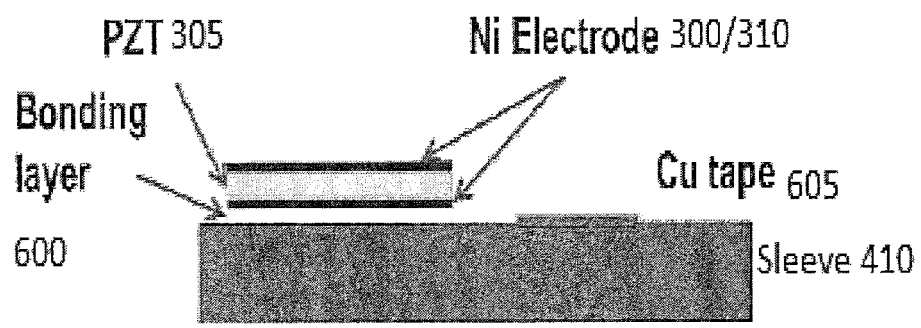
FIG. 6 illustrates a method for mounting a piezoelectric patch to the sleeve of the connector in accordance with aspects of the disclosure.

Each PZT patch $10_1$-$10_N$ is mounted to the connector 30, e.g., to the sleeve. The PZT patch 10 may be mounted to the connector 30 via a direct bonding (DB) method (as shown in FIG. 6). Alternative, a copper (Cu) tape bonding method may be used. In the Cu tape bonding method, an adhesive Cu tape is attached partially to the negative electrode 310 of the PZT patch 10, and the negative side with the Cu tape is bonded to the connector using an adhesive layer (bonding layer). The Cu tape is sandwiched between the PZT patch 10 and the connector 30 and serves as a negative electrode termination for wiring.

A bonding layer 600 between a PZT patch 100 and a host structure (e.g., sleeve 410) has a profound impact on the overall performance of system 1. The performance is impacted by thickness of the layer, the bonding method, bonding material and hardness of the same.

In the DB method (FIG. 6), the negative electrode 310 is bonded directly to the connector 30 using adhesive (bonding material). In an aspect of the disclosure, a Cu tape 605 is mounted near the patch 10. The Cu tape 605 is electrically coupled to the negative electrode 310 and serves as a negative electrode termination for the wiring, e.g., allows a wire to be in electrical communication or coupled to the negative electrode 310. In operation, the Cu tape is directly connected to the wire connecting to the acquisition system 100.

Figure 7:
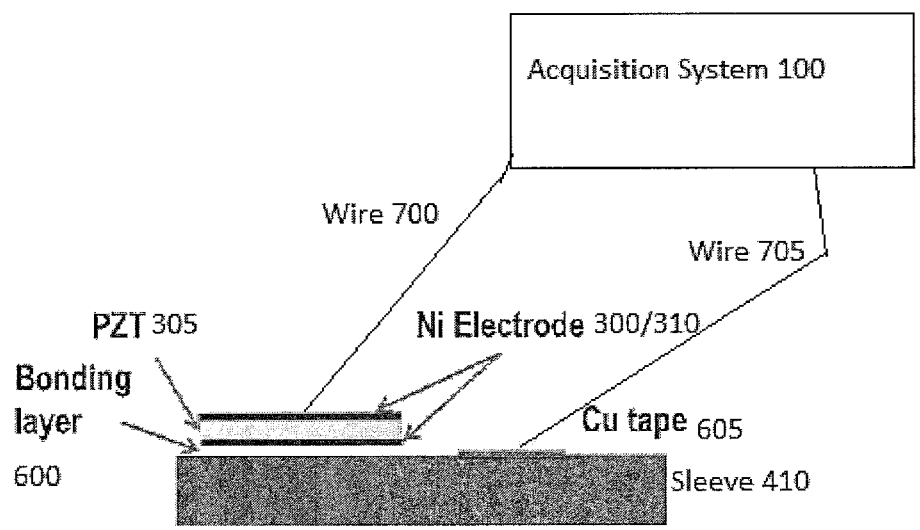
FIG. 7 illustrates a diagram of the acquisition system electrically coupled to a piezoelectric patch in accordance with aspects of the disclosure.

FIG. 7 illustrates a diagram of the acquisition system 100 electrically coupled to a PZT patch 10 via wiring when the DB method is used to mount the PZT patch 10 to the sleeve 410. One wire 700 is connected to the positive electrode 300. The wire 700 may be connected via soldering. A second wire 705 is connected to the Cu tape 605. Similarly, the wire 705 may be connected to the Cu tape 605 via soldering. Since the Cu tape 605 and the negative electrode 310 are mounted to the sleeve 410, which is aluminum, the current flows to the Cu tape 605. Additionally, the PZT material 305 and the bonding layer 600 are connected in series. Thus, the current at the PZT material and the bonding layer 600 are equal, and by association current at the negative electrode. Therefore, a current measured at the Cu tape 605 is equal to the current as if measured at the negative electrode. The reference to current herein is AC current. Thus, the wire 705 which is directly connected to the Cu tape 605, receives the current "associated with the negative electrode 310" or referred to herein as "current associated with the PZT patch 10" and the impedance analyzer 210 is in electrical communication with the negative electrode 310 (electrically coupled). Wires 700/705 are connected to the acquisition system 100 via the switches 208 which were described above (not shown in FIG. 7). In other bonding methods, the Cu tape may not be adjacent to the PZT patch, but rather connected to the negative electrode. In these bonding methods, the Cu tape would still act as the negative termination and the wire 705 is directly connected thereto.

In an aspect of the disclosure, a high-temperature epoxy is used as the adhesive (bonding layer 600 to bond the PZT patch 10 to the connector, e.g., sleeve 410. The epoxy bonding serves as a dielectric layer between the PZT 305 and the sleeve 410 in the PZT integration.

In an aspect of the disclosure, a soft bonding layer is used. For example, a Duralco 4538 series high-temperature epoxy may be used to reduce a likelihood of PZT patch 10 cracking. The soft bonding layer has the capacity to relax a tensile stress within the PZT patch 10. Cracking of a PZT patch 10 is mainly attributed to the tensile stress induced by thermal mismatch strain in a heating cycle.

More specifically, a Duralco 4538D epoxy may be used. Duralco 4538D epoxy has a hardness (shore A) of 30, a tensile/flexural strength of 8.274 MPa and an elongation percent of 800. This epoxy should also meet the temperature requirements of overhead transmission line connectors. For example, Duralco 4538 series has a working temperature of 232° C. Other epoxies may be used have similar proprieties including hardness such as a hardness less than 30.

In another aspect of the disclosure, the bonding layer 600 should not have a coefficient of thermal expansion (CTE) the same as the CTE of the PZT material 305. This is because the CTE of the connector 30 is large and the difference between the CTE of the connector 30 and PZT material 305 is larger. Selecting a bonding layer 600 with a CTE matching that of the PZT material 305 may cause the PZT patch 10 to fail if the CTE does not match that of the host structure (e.g., sleeve 410).

In an aspect of the disclosure, the thickness of the bonding layer 600 depends on the thickness of the PZT material 305. For example, the thickness of the bonding layer may be about ⅓ of the thickness of the PZT material 305.

In an aspect of the disclosure, the bonding layer may have a thickness of about 0.030 mm.

In another aspect of the disclosure, the PZT patches 10 may be formed in a macro fiber composite, which is flexible. The macro fiber composite is compatible to curved surfaces such as surfaces of the sleeve 410 of the connector 30. The PZT patches 10 comprise PZT fibers with a polymer, instead of a PZT layer or plate. The PZT fibers may be aligned in a single direction. The PZT fibers are sandwiched between positive and negative electrodes.

In another aspect of the disclosure, both macro fiber composite patches and PZT plate patches may be used. For example, macro fiber composite patches may be used in the core-grip section of the connector 30 and PZT plate patches may be used in the conductor section.

As described above, the structural health of the connector is determined based on a comparing of signatures with baseline signatures.

The baseline signatures are preset or stored in memory 205A. For example, the baseline signature may be stored at the time of installation of the connector 30 into the transmission line 20 or during offline testing prior to installation.

In an aspect of the disclosure, the baseline signatures are determined for each of the plurality of PZT patches $10_1$-$10_N$, sequentially.

The processor 205 couples a first PZT patch, e.g., $10_1$, to the acquisition system 100. The processor 205 closes the switches for PZT patch $10_1$ and opens the remaining switches for PZT patches $10_2$-$10_N$. The processor 205 records the temperature as detected by the temperature sensor 225. Then the processor 205 causes the impedance analyzer 210 to supply the AC voltage in a frequency range using a step size, e.g., frequency sweep, to PZT patch $10_1$. For each frequency, the impedance analyzer 210 receives the PZT patch response, e.g., current. The impedance analyzer 210 calculates the impedance (real and imaginary) based on the AC voltage and the PZT patch response (e.g., current or converted current into voltage). The processor 205 retrieves the calculated impedance. The calculated impedance is stored in memory 205A in association with the frequency and a unique identifier of the PZT patch 10. The processor 205 converts the calculated impedance into the conductance and stores the same. In an aspect of the disclosure, the impedance is stored only long enough to calculate the conductance and subsequently deleted.

The calculation of impedance and conversion is repeated for each frequency in the frequency sweep and stored in memory 205A in association with the respective frequency and the unique identifier of the PZT patch.

Once the frequency sweep is finished for the PZT patch $10_1$, the processor 205 opens the switches associated with PZT patch $10_1$ and moves on to the next PZT patch, e.g., $10_2$. The above process is repeated for each of the PZT patches 10 to generate baseline conductance and impedances values for each frequency in the frequency sweep and for each PZT patch 10.

The baseline values may also be determined for multiple operational temperatures for temperature compensation. For each temperature, the above process is repeated.

Figure 8:
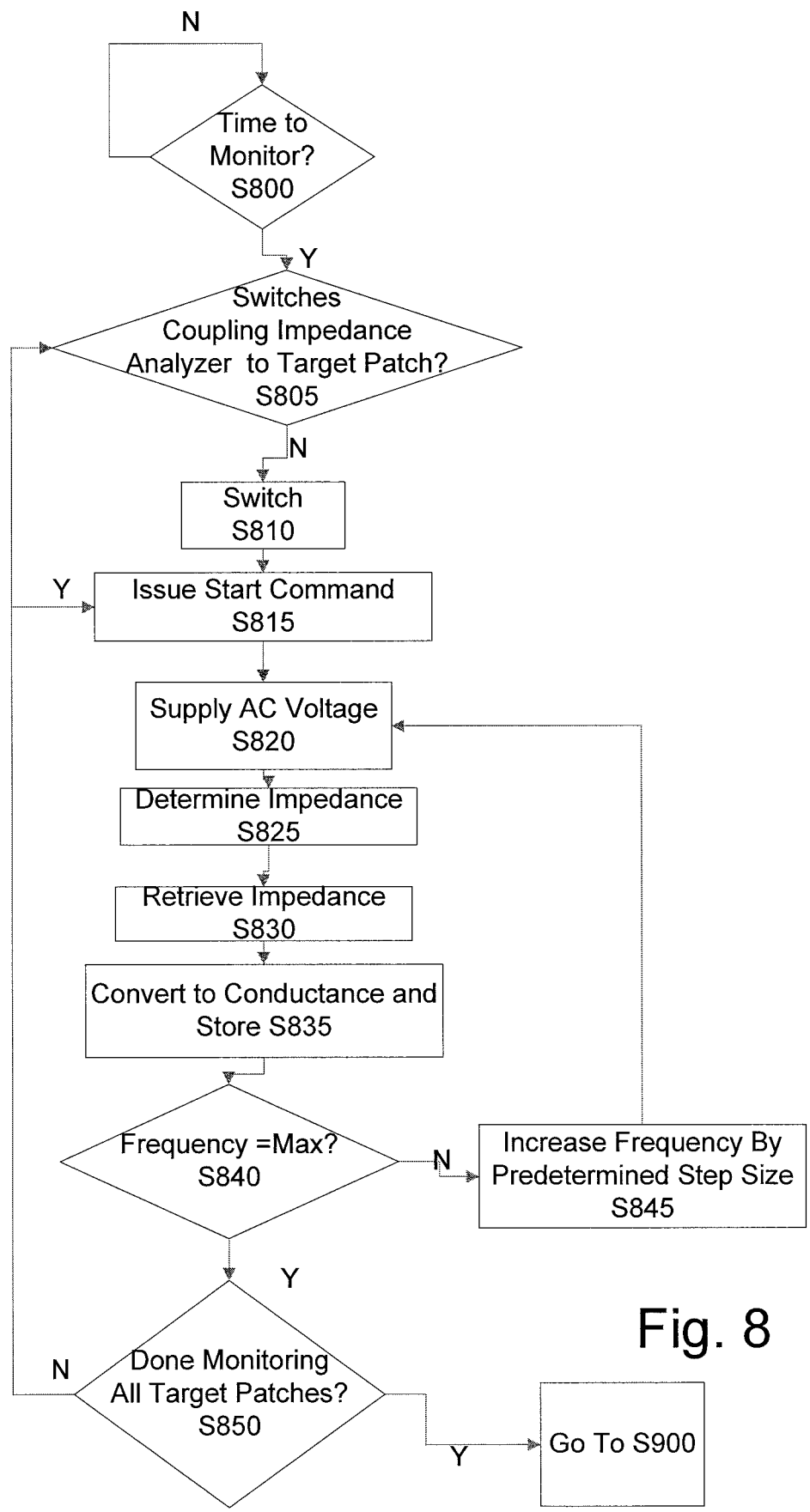
FIGS. 8 and 9 illustrate a method for monitoring and determining a structural health of a connector in accordance with aspects of the disclosure.
Figure 9:
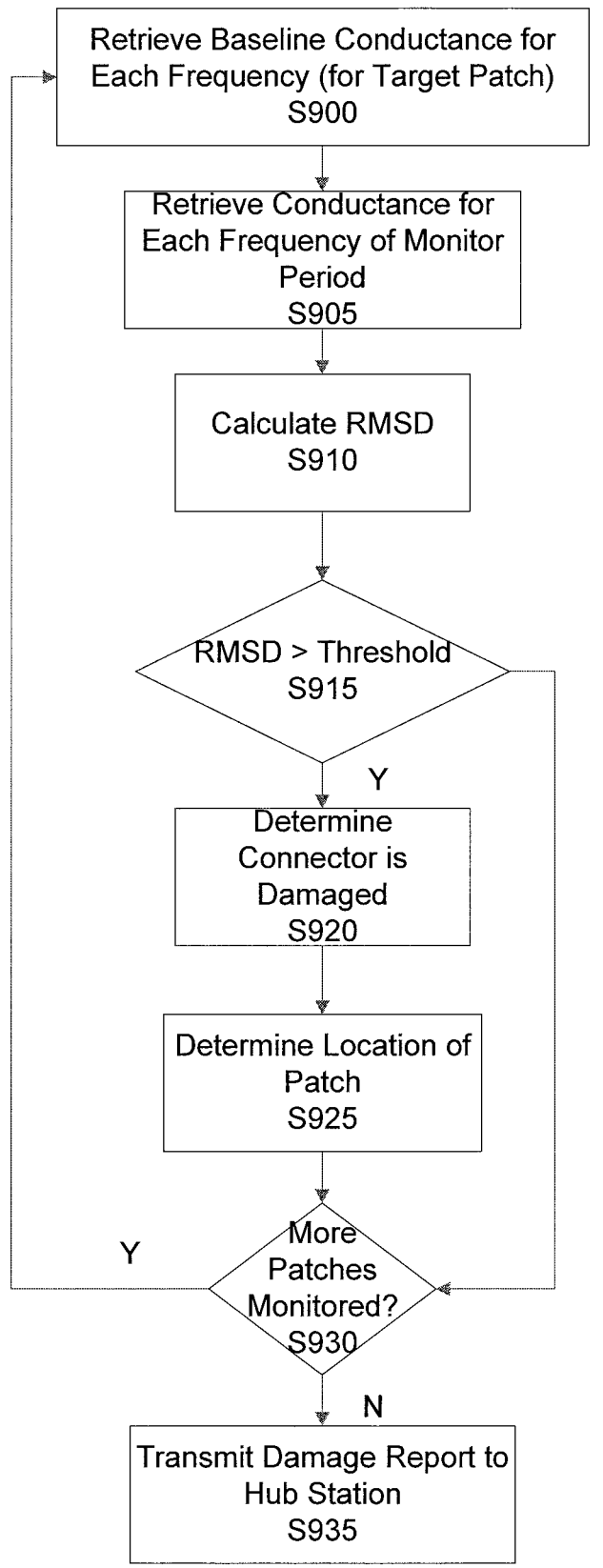

FIGS. 8 and 9 illustrate a method for monitoring and determining a structural health of a connector 30 in accordance with aspects of the disclosure.

At S800, the processor 205 determines if it is time to actuate at least one PZT patch 10, e.g., time to monitor. This determination may be made with reference to a stored schedule in memory 205A. The processor 205 comprises an internal clock. The current time is compared with the scheduled time. When the current time is a scheduled time, the processor 205 determines that it is time to actuate at least one PZT patch ("Y" at S800), otherwise the processor waits ("N" at S800).

In another aspect of the disclosure, this determination may be made based on an on-demand request received from the hub station 150. The processor 205 determines whether a request to actuate has been received from the hub station 150 via the communication interface 215. When a request to actuate at least one PZT patch 10 is received, the processor 205 determines that it is time to actuate at least one PZT patch ("Y" at S800), otherwise the processor waits ("N" at S800).

Additionally, at S800, the processor 205 determines which PZT patches 10 to actuate (and, in an aspect of the disclosure an order of actuation). As a default, a scheduled measurement session may include actuation sequentially of all PZT patches 10 in the system 1. However, when the measurement session is triggered by the hub station 150, the instruction may include a list of unique identifiers or locations of specific PZT patches 10 to actuate. The processor 205 determines which PZT patch to actuate by examining the on-demand instruction for the unique identifiers or locations and matches the same with the stored identifiers and locations in memory 205A.

At S805, the processor 205 determines whether a target patch, e.g., first PZT patch in the sequence or a PZT patch listed in the on-demand request is coupled to the impedance analyzer 210 via the switches 208. The processor 205 determines the state of each switch, e.g., opened/closed. When it is a scheduled measurement session, one of the PZT patches 10 is predetermined as the first PZT patch for actuation, e.g., PZT patch $10_1$. Accordingly, the processor 205 determines whether the switch(es) connected to the wires 700/705 for the target PZT patch (e.g., $10_1$) are closed and the remaining switches are open. If the processor 205 determines that the states of the switches are correct, the process moves to S815, otherwise, the processor 205 controls the switches 208 to open/close as needed at S810.

At S815, the processor 205 issues an instruction to the impedance analyzer to start the frequency sweep at the preset start frequency, e.g., minimum frequency.

At S820, the impedance analyzer 210 supplies the AC voltage to the first PZT patch for actuation, e.g., PZT patch $10_1$, via corresponding wires 700/705. In an aspect of the disclosure, the AC voltage is supplied from the impedance analyzer 210 to a PZT patch via wire 700.

At S825, the impedance analyzer 210 senses the response of the structure by detecting the current through same PZT patch (e.g., $10_1$) which is received by the impedance analyzer 210 via the corresponding wires 700/705. In an aspect of the disclosure, the response is received by the impedance analyzer 210 via wire 705.

When a voltage is used for comparison, the impedance analyzer 210 converts the received current into a voltage. For example, a feedback resistor may be used. The converted voltage may be amplified using a programmable gain amplifier and filtered.

The impedance analyzer 210 may convert this voltage into a digital signal using an analog to digital converter and transforms the same into the frequency domain (DFT). The impedance analyzer subsequently calculates the impedance using a DFT version of the AC voltage output from the impedance analyzer 210 and the received PZT response, e.g., current converted into voltage and then converted into a digital signal.

Real and imaginary parts are stored in the registers in the impedance analyzer 210.

At S830, the processor 205 retrieves the determined impedance. For example, the processor 205 accesses the registers using an interface in the impedance analyzer and retrieves the stored values. At S835, the processor 205 converts the impedance into a conductance $G_j$, where j is the measurement point. In this case, j is 1. The impedance and conductance is stored in memory 205A.

At S840, a determination is made whether the AC voltage that was output by the impedance analyzer 210 is at the maximum frequency in the frequency range for the frequency sweep. For example, the processor 205 may determine whether the number of points equals the set number of points. In another aspect of the disclosure, the processor 205 may poll a status register in the impedance analyzer 210 to determine whether the frequency sweep is completed. When the frequency is less than the maximum frequency of the frequency range, the frequency of the AC voltage is increased by the predetermined step size at S845. In an aspect of the disclosure, the processor 205 may issue an instruction to the impedance analyzer 210 to increment the frequency by the step size. In another aspect of the disclosure, the processor 205 may issue another command to a control register of the impedance analyzer 210.

Processes 820-835 are repeated for the new frequency of the AC voltage. Processes 820-835 are repeated for each frequency in the frequency sweep, e.g., until the frequency of the AC voltage equal the maximum frequency in the frequency range at S840 ("Y" at S840). Thus, for PZT patch $10_1$, an impedance value and conductance value is calculated and stored for each frequency. In another aspect of the disclosure depending on the size of the memory 205A, the conductance value may be stored without the impedance value in memory 205A.

When the frequency equals the maximum frequency in the frequency range, the processor 205 determines whether actuation of all of the target PZT patches is completed at S850. In an aspect of the disclosure, the processor 205 determines whether impedance values and/or conductance values are stored for all of the PZT patches scheduled for the measurement session. In a default, all of the PZT patches 10 are included in the measurement session. Therefore, at S850, the processor 205 determines whether the impedance values and conductance values are stored for all of the PZT patches 10. In another aspect of the disclosure, the processor determines whether the impedance values and conductance values are stored for all of the PZT patches 10 included in the instruction for an on-demand measurement session, e.g., all PZT patches included in the list of unique identifiers or locations.

When the processor 205 determines that there are other PZT patches 10 to be actuated ("N" at S850), processes S805-845 are repeated for the other PZT patches 10. The processor 205 changes the states of the switches as needed at S810 to the next target PZT patch.

When the processor 205 determines that all target PZT patches have been actuated ("Y" at S850), the process moves to S900.

At S900, the processor 205 retrieves the baseline values for a target PZT patch. For example, the processor 205 retrieves the baseline values for PZT patch 10₁ from memory 205A. In an aspect of the disclosure, prior to retrieving the baseline values, e.g., conductance, the processor 205 reads out a current temperature from the temperature sensor 225. As described above, the processor 205 selects the baseline values corresponding to the operating temperature as detected by the temperature sensor 225. When there is no baseline values (a set of values) for the detected temperature, the processor 205 may use two or more sets of baseline values, e.g., conductance values for each frequency, to interpolate the baseline values for the detected operating temperature.

At S905, the processor 205 retrieves the calculated conductance values for each frequency of the frequency sweep for PZT patch 10₁ from memory 205A (for the measurement session). At S910, the processor 205 determines a damage index (DI) using a root mean square deviation (RMSD). The RMSD is determined using the following equation:

$$RMSD(\%) = \sqrt{\frac{\sum_{j=1}^{N}(G_j^1 - G_j^0)^2}{\sum_{j=1}^{N}(G_j^0)^2}} \times 100 \quad (1)$$

$G_j^1$ is the conductance in the measurement session at the jth measurement point, and $G_j^0$ is the corresponding baseline value. A measurement point is one of the frequencies in the frequency sweep and the number of measurement points equals the number of frequencies in the frequency sweep, e.g., N.

Figure 10:
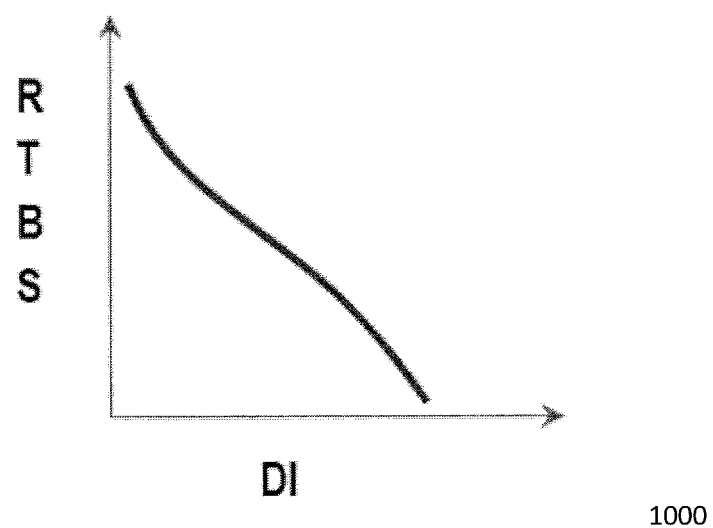
FIG. 10 is a graph depicting an example of a correlation between the RTBS of a connector and a damage index.

The structural health of the connector 30 is correlated to a value of the RMSD. A non-zero RMSD means that the structure of the connector 30 has changed from the baseline. The larger the RMSD means a greater change has occurred. Therefore, the rated tensile breaking strength (RTBS) can be correlated with the DI (e.g., RMSD). FIG. 10 is a graph 1000 depicting an example of a correlation between the RTBS of a connector 30 and the DI (e.g., RMSD). The DI may be used to forecast the lifetime of a connector 30 as well as a tool for scheduling maintenance or replacement of the connectors 30 prior to failure.

At S915, the processor 205 compares the calculated DI (e.g., RMSD) with a preset threshold. The threshold may be determined by prior testing of the connector 30. For example, tensile testing may be used to generate the threshold. One example of a tensile test may be a pull test applying a force to the ends of the conductor sections to simulate the suspension force on the connector 30. In an aspect of the disclosure, the threshold may be set to a particular value that allows for the connector to be replaced prior to failure. Different thresholds may be used in different power transmission systems based on scheduling of maintenance and expected usage rate. When the RMSD exceeds the threshold, the processor 205 determines that the connector 205 is damaged ("Y" at S915) at S920 and stores the determination in memory 205A.

At S925, the processor 205 retrieves the location information of the PZT patch (e.g., 10₁), stored in memory 205A to determine the location of the damage.

At S930, the processor 205 determines whether all of the PZT patches 10 for the measurement session have been evaluated. When the processor 205 determines that other PZT patches 10 need to be evaluated, S900-925 are repeated, otherwise the process moves to S935.

At S935, the processor 205 generates a damage report for the connector 30. In an aspect of the disclosure, the damage report comprises a list of the unique identifiers and/or locations of each PZT patch 10 in the measurement session and whether the DI (RMSS) exceeded the preset threshold and the value of the DI for each. In another aspect of the disclosure, the damage report may only include the unique identifiers and/or locations for the PZT patches whose DI exceeded the preset threshold and the DI for the same. Additionally, in an aspect of the disclosure, the damage report includes the time of the measurement session.

The processor 205 transmits the damage report to the hub station 150 via the communication interface 215.

In another aspect of the disclosure, instead of the processor 205 calculating the RMSD and comparing the same with the preset threshold, the processor 205 may transmit the raw data, e.g., baseline values and measurement session values for the conductance to the hub station 150 for evaluation. In this aspect of the disclosure, the memory 205A may not include the preset threshold.

In another aspect of the disclosure, a signature of a frequency response function (FRF) may be used instead of the conductance to determine the structural health of the connector 30. In this aspect of the disclosure, a PZT patch is actuated while another PZT patch acts as a sensor for the actuation (instead of the same PZT patch being actuated and sensed/detected).

Figure 11A:
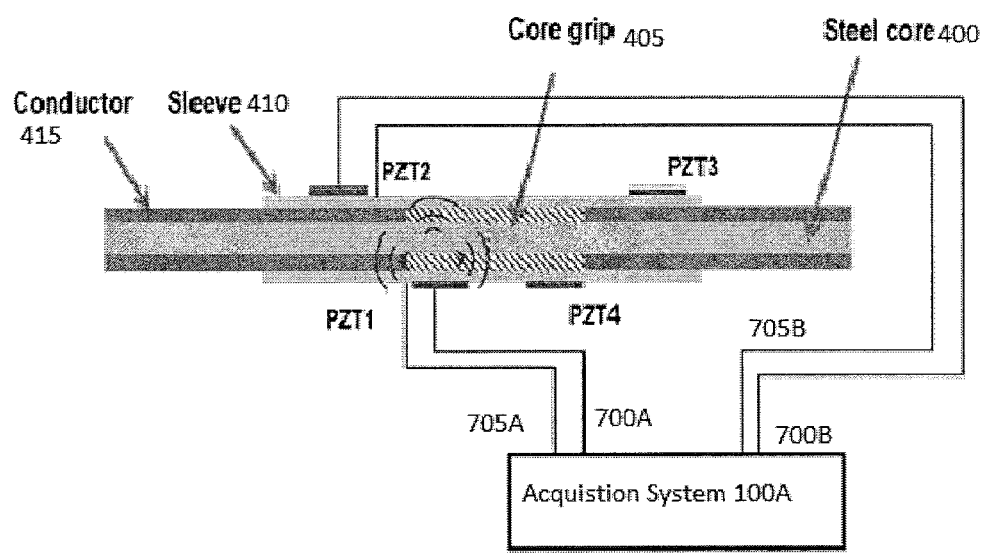
FIG. 11A illustrates a diagram of the acquisition system actuating a piezoelectric patch and detecting the response of the actuation from another piezoelectric patch in accordance with aspects of the disclosure.

FIG. 11A illustrates a diagram of an acquisition system 100A actuating a piezoelectric patch (e.g., PZT1) and detecting the response of the actuation from another piezoelectric patch (e.g., PZT2) in accordance with another aspect of the disclosure. The PZT patches are mounted to the sleeve 410 of the connector 30 using the DB method described above. As described above, for the DB method, wires (e.g., 705A and 705B) are coupled to a Cu tape (the Cu tape is not shown in FIG. 11A). The Cu tape serves as a negative electrode termination for the wiring.

Figure 11B:
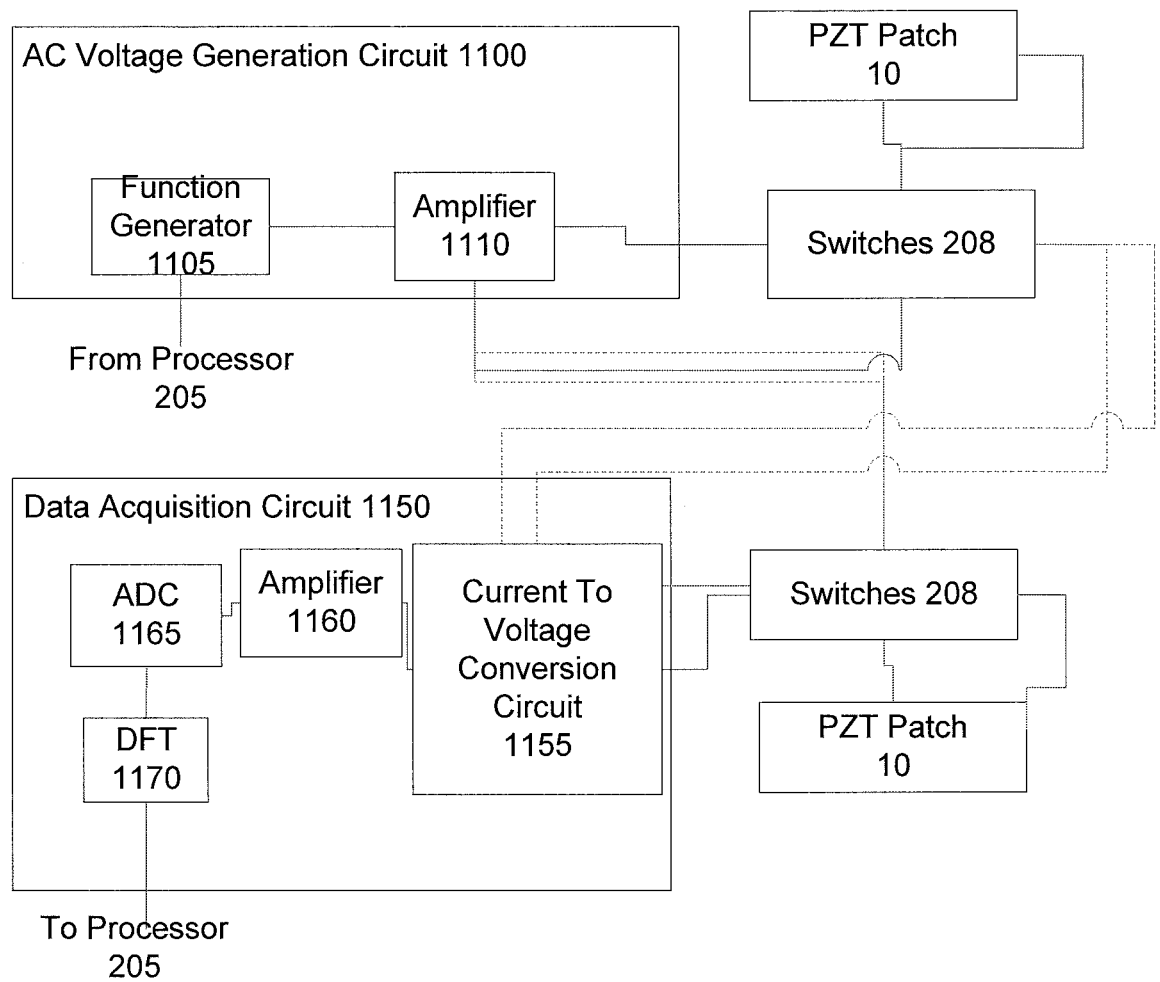
FIG. 11B illustrates a block diagram of a portion of an acquisition system in accordance with aspects of the disclosure.

A difference between acquisition system 100A and acquisition system 100 is that acquisition system 100 is electrically coupled to one PZT patch at a time, whereas the acquisition system 100A is coupled to a pair of PZT patches (e.g., PZT1 and PZT2) at the same time. Another difference between the acquisition systems is that acquisition system 100A does not include an impedance analyzer 210, but rather has an AC voltage generation circuit 1100 and data acquisition circuit. A portion of the acquisition system 100A is shown in FIG. 11B showing the differences. The AC voltage generation circuit 1100 comprises a function generator 1105 and an amplifier 1110. The AC voltage generation circuit 1100 provides an AC voltage from a minimum frequency to a maximum frequency using a preset step size. The AC voltage generation circuit 1100 also provides the AC voltage having a user defined amplitude. As described above, the frequencies, step size and amplitude may be set via the hub station 150.

A response to the actuation is sensed by a data acquisition circuit 1150. The data acquisition circuit 1150 comprises a current to voltage conversion circuit 1155, an amplifier (gain) 1160 and ADC 1165, and a DFT 1170. In another aspect of the disclosure, the processor 205 performs the DFT. The current to voltage conversion circuit 1155 may be similar to the current to voltage conversion circuit in the AD5933.

In an aspect of the disclosure, the switches 208 selectively couple the wires to one of the AC voltage generation circuit 1100 and the data acquisition circuit 1150. For example, when wires 700A/705A are coupled to the AC voltage generation circuit 1100, wires 700B/705B are coupled to the data acquisition circuit 1150 and vice versa. The selective coupling is shown in FIG. 11B as solid and dashed lines.

In the example shown in FIG. 11A, the acquisition system 100A is coupled to PZT1 and PZT2. Accordingly, the processor 205 controls the switches such that the switches for wires 700A/705A and 700B/705B are closed while the remaining switches are opened. Additionally, as depicted PZT1 is actuated and PZT2 senses the response to the actuation, which in turn is sensed by the acquisition system 100A.

For example, the AC voltage generation circuit 1100 under the control of the processor 205 supplies an AC voltage to PZT1 via wires 700A/705A. As a result of the piezoelectric effect, a current flows through the PZT2. This current is detected via the wires 700B/705B by the data acquisition circuit 1150. Subsequently, the current to voltage conversion circuit 1155 converts the current into a voltage, ADC 1165 converts into digital form and DFT 1170 transforms the same into a frequency domain. The processor 205 is configured to calculate a FRF based on the voltage (converted from the received current) and the output AC voltage from the AC voltage generation circuit 1150.

Similar to above, the processor 205 determines the state of health of the connector 30 based on the change of the signature (FRF) over time, e.g., between a baseline and the measurement session.

The baseline values may be determined when the connector 30 is installed or offline prior to installation.

In an aspect of the disclosure, the baseline signatures are determined for pairs of PZT patches. For example, pairs of PZT patches including PZT1-PZT2, PZT1-PZT3, PZT1-PZT4, PZT4-PZT1, PZT4-PZT2, etc.

The following is a description of determining the baseline signature for a PZT patch pair.

The processor 205 couples a first pair of PZT patches, e.g., PZT1-PZT2, to the acquisition system 100A. The processor 205 closes the switches for PZT1-PZT2 and opens the remaining switches for PZT patches, e.g., PZT3 and PZT4. The processor 205 records the temperature as detected by the temperature sensor 225. Then the processor 205 causes the AC voltage generation circuit 1100 to supply the AC voltage in a frequency range using a step size, e.g., frequency sweep, to the PZT1. For each frequency, the data acquisition circuit 1150 receives the current (response) of PZT2 via the respective wires. The current to voltage conversion circuit 1155 converts the received current into an AC voltage. The ADC 1165 also converts the AC voltage into a digital signal and the DFT 1170 performs a DFT on the digital signal.

The processor 205 retrieves the AC voltage (converted via DFT) and calculates a FRF. H represents the magnitude of the FRF. H is determined by the following equation:

$$H = \left|\frac{Y(f)}{X(f)}\right|, \quad (2)$$

where Y is the received and converted voltage transformed into frequency domain as a function of frequency f and X is the AC voltage output by the AC voltage generation circuit 1100 transformed into the frequency domain as a function of frequency f, respectively. The calculated FRF is stored in memory 205A in association with the frequency and PZT patch pair, e.g., unique identifiers of the pair. The calculation of the FRF is repeated for each frequency in the frequency sweep and stored in memory 205A in association with the respective frequency.

Once the frequency sweep is finished for the patch pair, the processor 205 opens the switches associated with one of the PZT patches in the pair and moves on to the next PZT patch (e.g., PZT3) to form PZT patch pair PZT1-PZT3. The above process is repeated for patch pair to generate baseline values for each frequency in the sweep for patch pairs.

The baseline values may also be determined for multiple operational temperatures. For each temperature, the above process is repeated.

Figure 12:
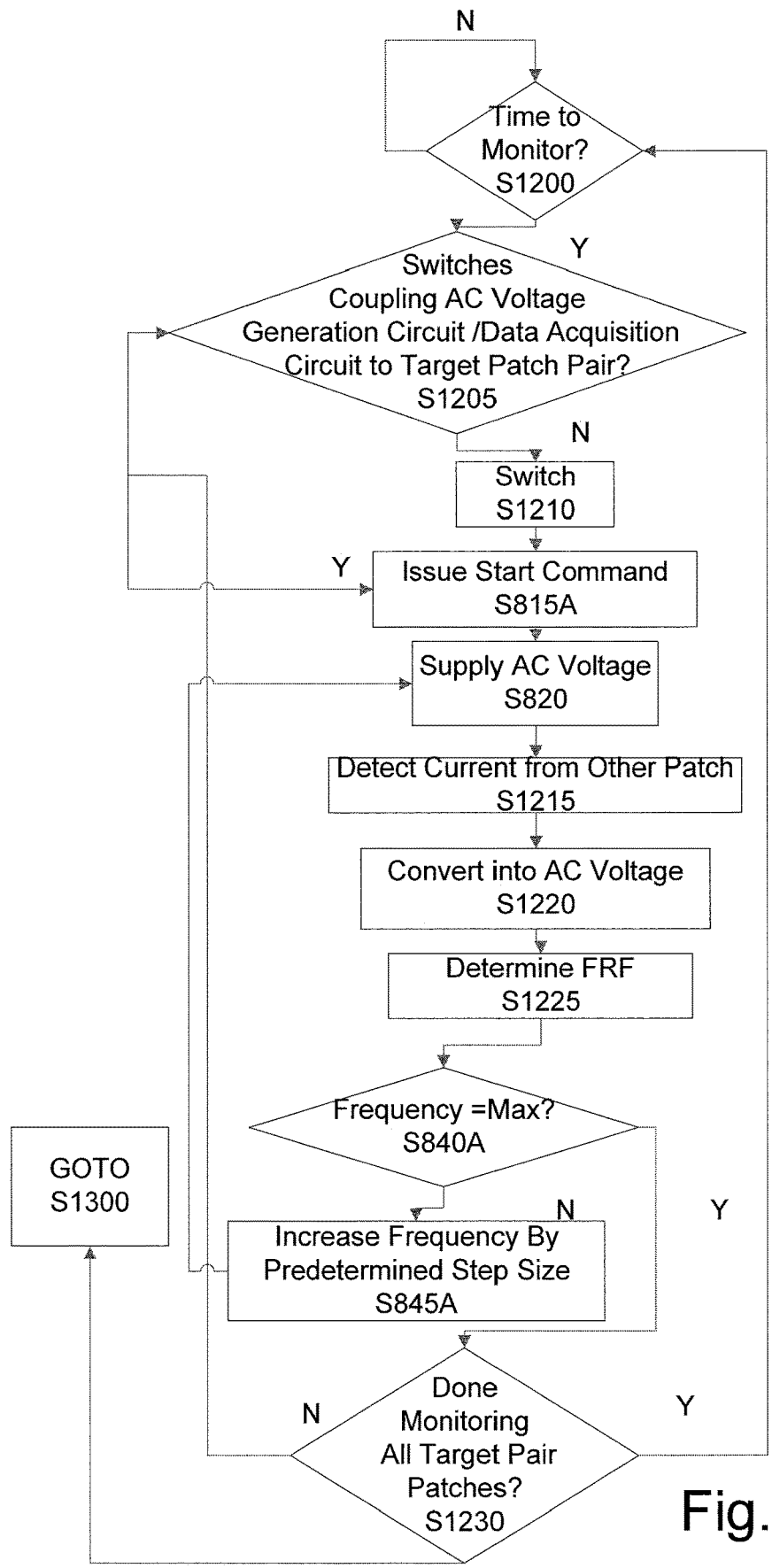
FIGS. 12 and 13 illustrate a method for monitoring and determining a structural health of a connector is accordance with aspects of the disclosure.
Figure 13:
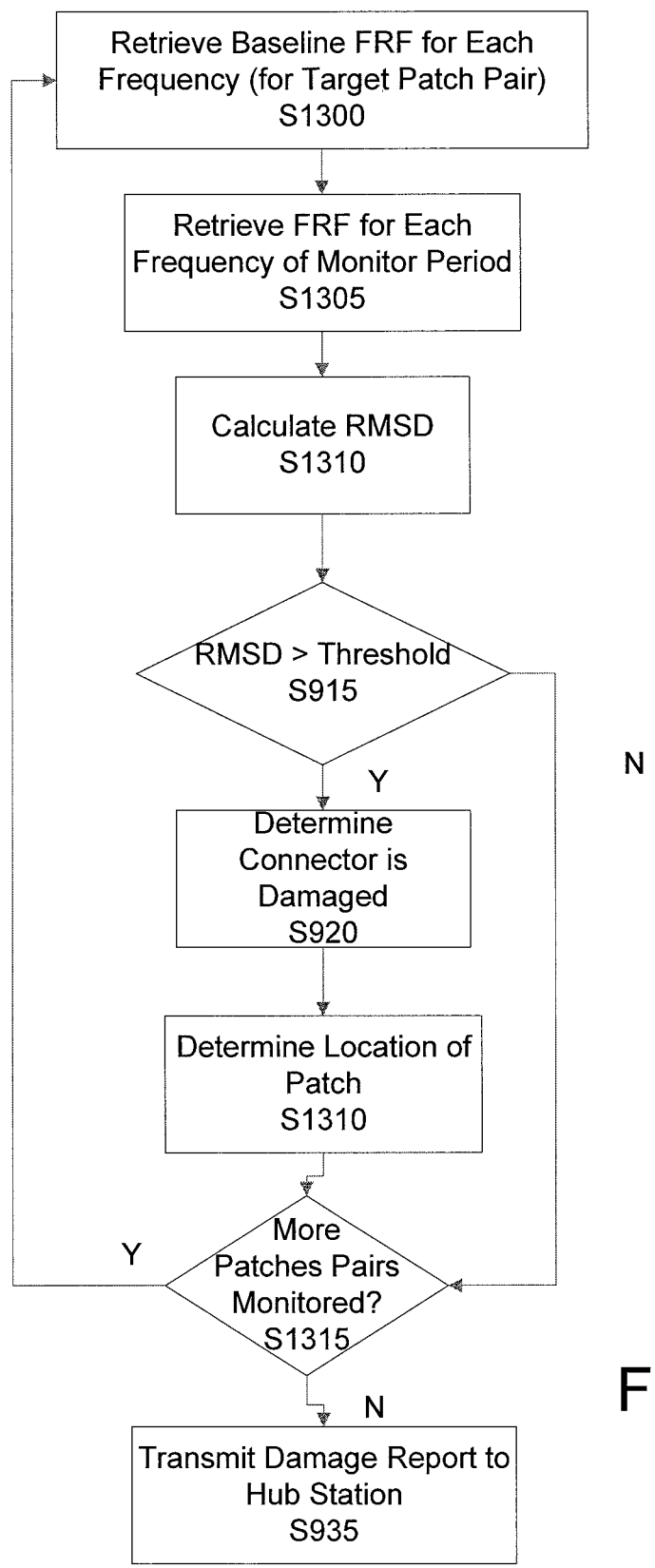

FIGS. 12 and 13 illustrate a method for monitoring and determining a structural health of a connector using the FRF.

At S1200, the processor 205 determines if it is time to actuate a PZT patch pair, e.g., time to monitor. This determination may be made with reference to a stored schedule in memory 205A. The processor 205 comprises an internal clock. The current time is compared with the scheduled time. When the current time is a scheduled time, the processor 205 determines that it is time to actuate at least one PZT patch ("Y" at S1200), otherwise the processor waits ("N" at S1200).

In another aspect of the disclosure, this determination may be made based on an on-demand request received from the hub station 150. The processor 205 determines whether a request to actuate has been received from the hub station 150 via the communication interface 215. When a request to actuate a PZT patch pair is received, the processor 205 determines that it is time to actuate the same ("Y" at S1200), otherwise the processor waits ("N" at S1200).

Additionally, at S1200, the processor 205 determines which PZT patch pair to actuate (and, in an aspect of the disclosure an order of actuation). As a default, a scheduled measurement session may include actuation sequentially of all PZT patch pairs in the system 1. However, when the measurement session is triggered by the hub station 150, the instruction may include a list of unique identifiers or locations of specific PZT patches pairs to actuate. The processor 205 determines which PZT patch pair to actuate by examining the on-demand instruction for the unique identifiers or a location and matches the same with the stored identifiers and locations in memory 205A. In an aspect of the disclosure, the memory 205A stores a list of available PZT patch pairs.

At S1205, the processor 205 determines whether a target PZT patch pair, e.g., first PZT patch pair, in the sequence of PZT patch pairs or a PZT patch pair listed in the on-demand request is coupled to the AC voltage generation circuit 1100 and data acquisition circuit 1150 via the switches 208. The processor 205 determines the state of each switch, e.g., opened/closed.

When it is a scheduled measurement session, one of the PZT patch pairs is predetermined as a first PZT patch pair for actuation, e.g., PZT1-PZT2. Accordingly, the processor 205 determines whether the switch(es) connected to the wires 700A/705A and 700B/705B for the target PZT patch pair (e.g., PZT1-PZT2) are closed to couple PZT1 to the AC voltage generation circuit 1100 and PZT2 to the data acquisition circuit 1150 and the remaining switches are open. If the processor 205 determines that the states of the switches are correct, the process moves to S815, otherwise, the processor 205 controls the switches 208 to open/close as needed at S1210.

At S815A, the processor 205 sets the frequency for the AC voltage output by the AC voltage generation circuit 1100 to the minimum value for the preset frequency range. For example, the processor 205 issues an instruction to the function generator 1105. In an aspect of the disclosure, the processor 205 issues a command comprising the AC amplitude, the frequency range and time series data x(t) to the function generator 1105. In an aspect of the disclosure, the function generator 1105 comprises a memory (not shown).

At S820, the AC voltage generation circuit 1100 supplies the AC voltage to the one of the PZT patches in the PZT patch pair, e.g. PZT1, for actuation via corresponding wires 700A/705A.

At S1215, the data acquisition circuit 1150 senses the response of the structure by detecting the current through the other PZT patch in the PZT patch pair, e.g., PZT2, which is received via the corresponding wires e.g., 700B/705B. The current to voltage conversion circuit 1155 converts the sensed current into an AC voltage (at S1220) and then digitizes the signal using the ADC 1165 and transforms the same into the frequency domain (DFT 1170), e.g. Y(f).

At 1225, the processor 205 determines the FRF. In an aspect of the disclosure, the processor 205 retrieves the x(t) data from memory and performs a DFT to obtain (X(f)). Additionally, the processor 205 retrieves the response data, e.g., converted and DFT data (Y(f)) and calculates the FRF using equation 2.

At S840A, a determination is made whether the AC voltage that was output is at the maximum frequency in the frequency range for the frequency sweep. When the frequency is less than the maximum frequency of the frequency range, the frequency of the AC voltage is increased by the predetermined step size at S845A. For example, the processor 205 may issue an instruction to the function generator 1105.

Processes 820-1225 are repeated for the new frequency of the AC voltage. Processes 820-1225 are repeated for each frequency in the frequency sweep, e.g., until the frequency of the AC voltage equal the maximum frequency in the frequency range at S840A ("Y" at S840A). Thus, for a PZT patch pair, the FRF is calculated and stored for each frequency.

When the frequency equals the maximum frequency in the frequency range, the processor 205 determines whether actuation of all of the target PZT patch pairs is complete at S1230. In an aspect of the disclosure, the processor 205 determines whether FRF is stored for all of the PZT patch pairs scheduled for the measurement session. In a default, all of the PZT patch pairs may be included in the measurement session. Therefore, at S1230, the processor 205 determines whether the FRF is stored for all of the PZT patch pairs in the system. In another aspect of the disclosure, the processor 205 determines whether the FRF is stored for all of the PZT patch pairs included in the instruction for an on-demand measurement session, e.g., all PZT patch pairs included in the list of unique identifiers or locations.

When the processor 205 determines that there are other PZT patch pairs to be actuated ("N" at S1230), processes S1205-845A are repeated for the other PZT patch pairs. The processor 205 changes the states of the switches as needed at S1210 to the next target PZT patch pair.

When the processor 205 determines that all target PZT patch pairs have been actuated ("Y" at S1230), the process moves to S1300.

At S1300, the processor 205 retrieves the baseline values for a target patch pair, e.g., PZT1-PZT2. For example, the processor 205 retrieves the baseline values for PZT1-PZT2 from memory 205A. In an aspect of the disclosure, prior to retrieving the baseline values, e.g., FRF, the processor 205 reads out a current temperature from the temperature sensor 225. As described above, the processor 205 selects the baseline values corresponding to the operating temperature as detected by the temperature sensor 225. When there is no baseline values (a set of values) for the detected temperature, the processor 205 may use two or more sets of baseline values, e.g., FRF values for each frequency, to interpolate the baseline values for the detected operating temperature.

At S1305, the processor 205 retrieves the calculated FRF values for each frequency of the frequency sweep for a PZT patch pair, e.g., PZT1-PZT2, from memory 205A (for the measurement session). At S1310, the processor 205 determines a damage index (DI) using a root mean square deviation (RMSD). The RMSD is determined using the following equation:

$$RMSD(\%) = \sqrt{\frac{\sum_{j=1}^{N}(H_j^1 - H_j^0)^2}{\sum_{j=1}^{N}(H_j^0)^2}} \times 100 \quad (3)$$

$H_j^1$ is the FRF magnitude in the measurement session at the jth measurement point, and $H_j^0$ is the corresponding baseline value.

The structural health of the connector 30 is correlated to a value of the RMSD. A non-zero RMSD means that the structure of the connector 30 has changed from the baseline. The larger the RMSD, the more change has occurred. Therefore, the rated tensile breaking strength (RTBS) can be correlated with the DI (e.g., RMSD). The DI may be used to forecast the lifetime of a connector 30 as well as a tool for scheduling maintenance or replacement of the connector 30 prior to failure.

At S915, the processor 205 compares the calculated DI (e.g., RMSD) with a preset threshold. The threshold may be determined by prior testing of the connector 30. For example, the threshold may be set to a particular value that allows for the connector to be replaced prior to failure. Different thresholds may be used in different power transmission systems based on scheduling of maintenance and expected usage rate. When the RMSD exceeds the threshold, the processor 205 determines that the connector 205 is damaged ("Y" at S915) at S920 and stores the determination in memory 205A.

At S1310, the processor 205 retrieves the location information of the PZT patch pair, stored in memory 205A to determine the location of the damage. In another aspect of the disclosure, a PZT patch pair chart or matrix is created. The matrix is constructed for the measurement session with each DI obtained by using a respective PZT patch (as the actuator in a row) and a respective PZT patch (as the sensor in a column) (actuator-sensor being the PZT patch pair). The location of the PZT patch pairs is used to identify the location of the damage.

At S1315, the processor 205 determines whether all of the PZT patch pairs for the measurement session have been evaluated. When the processor 205 determines that other PZT patch pairs need to be evaluated, S1300-1310 are repeated, otherwise the process moves to S935.

At S935, the processor 205 generates a damage report for the connector. In an aspect of the disclosure, the damage report comprises a list of the PZT patch pairs and/or locations of each PZT patch pair in the measurement session and whether the DI (RMSD) exceeded the preset threshold and the value of the DI for each. In another aspect of the disclosure, the damage report may only include the patch pairs and/or locations whose DI exceeded the preset threshold and the DI for the same. Additionally, in an aspect of the disclosure, the damage report includes the time of the measurement session.

The processor 205 transmits the damage report to the hub station 150 via the communication interface 215.

In another aspects of the disclosure, only a subset of available PZT patch pairs may be actuated in a given measurement session. For example, a preset schedule may only include certain PZT patch pairs for a specific measurement session. By limiting the number of PZT patch pairs in a given measurement session, battery power may be conserved. For example, in the example shown in FIG. 11A, PZT patch pairs PZT1-PZT2, PZT1-PZT3 and PZT4-PZT3 may be the PZT patch pairs used in a given measurement session. A subsequent measurement session may use other PZT patch pairs.

The phrase "PZT patch pairs" used herein refers to one of the PZT patches in the pair acting as the actuator and the other of the PZT patches in the pair acting as the sensor.

As described above, the processor 205 performs the data processing in the frequency domain. In another aspect of the disclosure, the processor 205 performs the data processing in the time-domain. In accordance with this aspect of the disclosure, the impedance analyzer 210 would omit the DFT. Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device, may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electro-magnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The terms "Processor" as may be used in the present disclosure may include a variety of combinations of fixed and/or portable computer hardware, software, peripherals, and storage devices. The "Processor" may include a plurality of individual components that are networked or otherwise linked to perform collaboratively, or may include one or more stand-alone components. The hardware and software components of the "Processor", of the present disclosure may include and may be included within fixed and portable devices such as desktop, laptop, and/or server, and network of servers (cloud).

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A system for determining a structural health of a compression connector, the system comprising:
    a plurality of piezoelectric patches attached to a sleeve of the compression connector at different locations, each piezoelectric patch comprising a positive electrode, a piezoelectric element and a negative electrode;
    an impedance analyzer in electrical communication with each piezoelectric patch via a respective first wire and a respective second wire, the impedance analyzer and the positive electrode of a respective piezoelectric patch is in electrical communication via the respective first wire, the impedance analyzer and the negative electrode of a respective piezoelectric patch is in electrical communication via the respective second wire;
    a processor configured to determine the structural health of the compression connector based on a determined impedance associated with a respective piezoelectric patch at each of a plurality of frequencies, determined at two different times, the impedance being determined based on an AC voltage and a detected current, at each of the plurality of frequencies for the respective piezoelectric patch; and
    a plurality of switches,
    wherein the processor is configured to selectively couple the impedance analyzer to the piezoelectric patches via one or more of the plurality of switches,
    wherein when the one or more switches couples the impedance analyzer to a respective piezoelectric patch, the impedance analyzer is configured to supply the AC voltage to the respective piezoelectric patch and detect the current associated with the respective piezoelectric patch, the AC voltage being supplied at the plurality of frequencies from a minimum frequency to a maximum frequency in a step size, and wherein the impedance analyzer is configured to determine the impedance associated with the respective piezoelectric patch based on the AC voltage and the detected current, at each of the plurality of frequencies.

2. The system of claim 1, wherein the negative electrode is bonded to the sleeve of the compression connector.

3. The system of claim 1, wherein the bonding is via an epoxy having a hardness less than 30 shore A.

4. The system of claim 2, further comprising an electrode attached to the sleeve of the compression connector adjacent to the piezoelectric patch, wherein the respective second wire is connected to the electrode and the electrode is in electrical communication with the negative electrode via the sleeve.

5. The system of claim 1, wherein the processor is configured to determine the structural health of the compression connector by converting the impedance into a conductance (G) for each of the plurality of frequencies and calculate a root mean square deviation, wherein one of the two different times is a baseline measurement, the baseline measurement being stored in a storage device.

6. The system of claim 4, wherein the respective first wire is connected to a connector attached to the positive electrode.

7. The system of claim 1, wherein the processor is configured to control the switches to sequentially couple each of the plurality of piezoelectric patches to the impedance analyzer.

8. The system of claim 1, further comprising a storage device configured to store a schedule for coupling a respective piezoelectric patch to the impedance analyzer, and wherein the processor is configured to control the switches based on the schedule.

9. The system of claim 8, wherein the processor is configured to determine the structural health of the compression connector based on the determined impedance associated with one or more of the plurality of piezoelectric patches, at each of the plurality of frequencies, determined at two different times.

10. The system of claim 9, wherein the processor, for the one or more of the plurality of piezoelectric patches, is configured to determine the structural health of the compression connector by converting the impedance into an conductance (G) for each of the plurality of frequencies and calculate a root mean square deviation based on the conductance for all of the plurality of frequencies obtained at the two different times, wherein one of the two different times is a baseline measurement, the baseline measurement being stored in a storage device.

11. The system of claim 10, wherein the processor, for the one or more of the plurality of piezoelectric patches, compares the calculated root mean square deviation with a threshold, and when the calculated root mean square deviation is greater than the threshold, the processor determines that the compression connector is damaged.

12. The system of claim 11, wherein the processor is configured to determine a location of the damage based on which of the one or more of the plurality of piezoelectric patches had the calculated root mean square deviation greater than the threshold.

13. The system of claim 1, wherein the compression connector is a two-stage aluminum conductor steel reinforced compression connector, the two-stage aluminum conductor steel reinforced compression connector comprising a core-grip section and a conductor section, at least one of the plurality of piezoelectric patches is attached to the sleeve surrounding the core-grip section and at least one of the plurality of piezoelectric patches is attached to the sleeve surrounding the conductor section.

14. The system of claim 9, further comprising a housing, wherein the impedance analyzer and the processor is disposed within the housing, and wherein the housing is mounted to a power transmission line.

15. The system of claim 14, further comprising a battery disposed within the housing, wherein the battery is electrically coupled to the processor and impedance analyzer, and wherein the battery is configured to supply power to the processor and impedance analyzer.

16. The system of claim 15, wherein the battery is rechargeable via energy harvesting.

17. The system of claim 15, wherein the step size is based on a state of charge of the battery.

18. The system of claim 15, wherein a frequency of determining the structural health of the compression connector is based on a state of charge of the battery.

19. The system of claim 14, further comprising a communication interface disposed on the housing, the communication interface being configured, under the control of the processor, to transmit the determined structural health of the compression connector to a hub station.

20. The system of claim 19, wherein the hub station transmits a signal to the processor via the communication interface, the signal causing the processor to switch the coupling of the impedance analyzer to a specific piezoelectric patch for a measurement session.

21. A system for determining a structural health of a compression connector, the system comprising:
   a plurality of piezoelectric patches attached to a sleeve of the compression connector at different locations, the plurality of piezoelectric patches comprising a first piezoelectric patch and a second piezoelectric patch, each piezoelectric patch comprising a positive electrode, a piezoelectric element and a negative electrode;
   a voltage generation circuit in electrical communication with each piezoelectric patch via a respective first wire and a respective second wire, each first wire electrically coupling the voltage generation circuit and the positive electrode of the respective piezoelectric patch, each second wire electrically coupling the voltage generation circuit and the negative electrode of the respective piezoelectric patch, the voltage generation circuit configured to supply an AC voltage to the first piezoelectric patch, the AC voltage being supplied at a plurality of frequencies from a minimum frequency to a maximum frequency in a step size;
   a data acquisition circuit in electric communication with each piezoelectric patch via a respective first wire and a respective second wire, each first wire electrically coupling the data acquisition circuit and the positive electrode of the respective piezoelectric patch, each second wire electrically coupling the data acquisition circuit and the negative electrode of the respective piezoelectric patch, the data acquisition circuit configured to detect a current associated with the second piezoelectric patch, and convert the current associated with the second piezoelectric patch into a voltage;
   a plurality of switches configured to selectively couple each piezoelectric patch to one of the voltage generation circuit and the data acquisition circuit at a time; and
   a processor configured to determine the structural health of the compression connector based on a determined ratio at each of the plurality of frequencies, determined at two different times, wherein the ratio is determined from output AC voltage to the first piezoelectric patch and the voltage converted from the current associated with the second piezoelectric patch, at each of the plurality of frequencies.

22. The system of claim 21 wherein the plurality of switches is configured to selectively couple the voltage generation circuit to one of the plurality of piezoelectric patches and the data acquisition circuit to another of the plurality of piezoelectric patches, and wherein when the voltage generation circuit is coupled to the one of the plurality of piezoelectric patches, the data acquisition circuit is coupled to the another of the plurality of piezoelectric patches, the voltage generation circuit is configured to supply the AC voltage to the one of the plurality of piezoelectric patches and the data acquisition circuit is configured to detect a current associated with the another of the plurality of piezoelectric patches, the AC voltage being supplied at the plurality of frequencies from the minimum frequency to the maximum frequency in the step size, and the data acquisition circuit is further configured to convert the current associated with the another of the plurality of piezoelectric patches into a voltage; and the processor is further configured to determine the structural health of the compression connector based on the determined ratio at each of the plurality of frequencies, determined at two different times, wherein the ratio is determined from output AC voltage to the one of the plurality of piezoelectric patches and the voltage converted from the current associated with the another of the plurality of piezoelectric patches, at each of the plurality of frequencies.

* * * * *